(12) United States Patent     (10) Patent No.: US 12,346,641 B2
Chang et al.     (45) Date of Patent: Jul. 1, 2025

(54) LEARNING TO SIMULATE AND DESIGN FOR STRUCTURAL ENGINEERING

(71) Applicant: Autodesk, Inc., San Rafael, CA (US)

(72) Inventors: Kai-Hung Chang, El Cerrito, CA (US); Chin-Yi Cheng, Walnut Creek, CA (US); Mehdi Nourbakhsh, Richmond, CA (US)

(73) Assignee: AUTODESK, INC., San Francisco, CA (US)

( * ) Notice: Subject to any disclaimer, the term of this patent is extended or adjusted under 35 U.S.C. 154(b) by 1147 days.

(21) Appl. No.: 17/200,546

(22) Filed: Mar. 12, 2021

(65) Prior Publication Data

US 2021/0287138 A1    Sep. 16, 2021

Related U.S. Application Data

(60) Provisional application No. 62/988,845, filed on Mar. 12, 2020.

(51) Int. Cl.
*G06F 30/27* (2020.01)
*G06F 30/13* (2020.01)
*G06F 30/23* (2020.01)
*G06N 20/00* (2019.01)

(52) U.S. Cl.
CPC .............. *G06F 30/27* (2020.01); *G06F 30/13* (2020.01); *G06N 20/00* (2019.01); *G06F 30/23* (2020.01)

(58) Field of Classification Search
CPC .......... G06F 30/27; G06F 30/13; G06F 30/23; G06N 20/00
USPC ............................................................ 703/7
See application file for complete search history.

(56) References Cited

U.S. PATENT DOCUMENTS

| | | | | |
|---|---|---|---|---|
| 5,815,394 | A | * | 9/1998 | Adeli ...................... G06F 30/13 706/26 |
| 8,825,459 | B2 | * | 9/2014 | Aish ......................... G06F 8/34 703/7 |
| 9,697,326 | B1 | * | 7/2017 | Bowman ................ G06F 30/18 |
| 9,891,791 | B1 | * | 2/2018 | Khan ...................... G06T 17/20 |

(Continued)

OTHER PUBLICATIONS

Balogh et al. (Genetic algorithm based optimization of regular steel building structures subjected to seismic effects, WCEE, 2012, pp. 1-10) (Year: 2012).*

(Continued)

*Primary Examiner* — Iftekhar A Khan
(74) *Attorney, Agent, or Firm* — Gates & Cooper LLP

(57) ABSTRACT

A method and system provide the ability to optimize a structural engineering design. A dataset is synthesized by acquiring a structural skeleton design of an entire building. The skeleton defines locations and connectivities of bars that represent columns or beams. The skeleton design is represented as a structural graph with each bar represented as a graph node and edges connecting graph nodes. Structural simulation results are computed for the synthetic dataset based on the structural graph, various loads, and a structural analysis. A simulation model and a size optimization model are trained based on the structural simulation results with the size optimization model determining cross-section sizes for the bars to satisfy a building mass objective, building constraints, and output from the simulation model. The structural engineering design is output from the size optimization model.

18 Claims, 14 Drawing Sheets

(56) References Cited

U.S. PATENT DOCUMENTS

| | | | | |
|---|---|---|---|---|
| 10,190,792 | B2* | 1/2019 | Jacobson | F24F 11/30 |
| 10,699,043 | B2* | 6/2020 | Ho | G06N 3/006 |
| 11,488,062 | B1* | 11/2022 | Earthman | G06V 10/764 |
| 11,900,026 | B1* | 2/2024 | Schubert | G06N 3/045 |
| 2004/0044503 | A1* | 3/2004 | McConaghy | G06F 30/00 |
| | | | | 703/2 |
| 2011/0082638 | A1* | 4/2011 | Khorashadi | G01C 21/206 |
| | | | | 701/532 |
| 2012/0179430 | A1* | 7/2012 | Aish | G06F 8/34 |
| | | | | 703/1 |
| 2012/0203806 | A1* | 8/2012 | Panushev | G06Q 10/06 |
| | | | | 707/825 |
| 2016/0147843 | A1* | 5/2016 | Haley | G06F 16/9535 |
| | | | | 707/722 |
| 2018/0046732 | A1* | 2/2018 | Bergin | G06F 30/23 |
| 2021/0056242 | A1* | 2/2021 | De Zaeytijd | G06F 30/20 |
| 2021/0073449 | A1* | 3/2021 | Segev | G06F 30/27 |
| 2021/0150373 | A1* | 5/2021 | Crouse | G06N 5/013 |
| 2021/0287138 | A1* | 9/2021 | Chang | G06F 30/13 |
| 2022/0372068 | A1* | 11/2022 | Kim | G16B 40/20 |

OTHER PUBLICATIONS

Yeh et al. (Optimal Design of Steel cols. with Axial Load using Artificial Neural Networks, AMME 2017, pp. 189-194) (Year: 2017).*

Cao et al. (Skeleton and Infill Housing Construction Delivery Process Optimization Based on the Design Structure Matrix, MDPI 2018, pp. 1-18) (Year: 2018).*

Roith et al. (Supporting the building design process with graph-based methods using centrally coordinated federated databases, 2017, Springer, pp. 1-17) (Year: 2017).*

Langenhan et al. (Graph-based retrieval of building information models for supporting the early design stages, 2013, Elsevier, pp. 413-427) (Year: 2013).*

Achiam et al., "Constrained policy optimization". In Proceedings of the 34th International Conference on Machine Learning—vol. 70, pp. 22-31. JMLR.org, 2017.

Balogh et al., "Genetic algorithm based optimization of regular steel building structures subjected to seismic effects". In Proceedings 15th world conference on earthquake engineering, pp. 1-10, 2012.

Battaglia et al., "Relational inductive biases, deep learning, and graph networks". 40 pages, arXiv preprint arXiv:1806.01261, 2018.

Bello et al., "Neural combinatorial optimization with reinforcement learning". 15 pages, arXiv preprint arXiv:1611.09940, 2016.

International Energy Agency. World Energy Balances 2017. 21 pages, doi: https://doi.org/https://doi.org/ 10.1787/world energy bal-2017-en. URL https://www.oecd-ilibrary.org/content/ publication/ world_energy_bal-2017-en.

Yeh et al., "Optimal design of steel columns with axial load using artificial neural networks". DEStech Transactions on Engineering and Technology Research, (amme), pp. 189-194, 2017.

Cui et al., "Traffic Graph Convolutional Recurrent Neural Network: A Deep Learning Framework for Network-Scale Traffic Learning and Forecasting". IEEE Transactions on Intelligent Transportation Systems, vol. 21, No. 11, Nov. 2020, pp. 4883-4894.

Do et al., "Graph transformation policy network for chemical reaction prediction". In Proceedings of the 25th ACM SIGKDD International Conference on Knowledge Discovery & Data Mining, pp. 750-760, 2019.

Fout et al., "Protein interface prediction using graph convolutional networks". In Advances in neural information processing systems, pp. 6530-6539, 2017.

Frans et al., "Unsupervised image to sequence translation with canvas-drawer networks". arXiv preprint arXiv:1809.08340, 2018.

Greco, L. Machine learning and optimization techniques for steel connections. In Proceedings of IASS Annual Symposia, vol. 2018, pp. 1-8. International Association for Shell and Spatial Structures (IASS), 2018.

Guo et al., "Attention based spatial-temporal graph convolutional networks for traffic flow forecasting". In Proceedings of the AAAI Conference on Artificial Intelligence, vol. 33, pp. 922-929, 2019.

Haarnoja et al., "Soft actor-critic algorithms and applications". arXiv preprint arXiv:1812.05905, 17 pages, 2018.

Hamrick et al., "Relational inductive bias for physical construction in humans and machines". arXiv preprint arXiv:1806.01203, 7 pages, 2018.

Hasancebi et al., "A neural network approach for approximate force response analyses of a bridge population". Neural Computing and Applications, 22(3-4):755-769, 2013.

Imran et al., "Design optimization of composite submerged cylindrical pressure hull using genetic algorithm and finite element analysis". Ocean Engineering, 190:106443, 12 pages, 2019.

Zhou et al., "Model-based deep hand pose estimation". arXiv preprint arXiv:1606.06854, 7 pages, 2016.

Jang et al., "Categorical reparameterization with gumbel-softmax". arXiv preprint arXiv:1611.01144, 13 pages, 2016.

Jin et al., "Junction tree varia-tional autoencoder for molecular graph generation". arXiv preprint arXiv:1802.04364, 17 pages, 2018a.

Jin et al., "Learning multimodal graph-to-graph translation for molecular optimization". arXiv preprint arXiv:1812.01070, 13 pages 2018b.

Kipf et al., "Neural relational inference for interacting systems". arXiv preprint arXiv:1802.04687, 17 pages, 2018.

Kipf et al., "Semi-supervised classification with graph convolutional networks". arXiv preprint arXiv:1609.02907, 14 pages, 2016.

Kool et al., "Attention, learn to solve routing problems!" arXiv preprint arXiv:1803.08475, 2018.

Li et al., "Combinatorial optimization with graph convolutional networks and guided tree search". In Advances in Neural Information Processing Systems, pp. 539-548, 2018.

Prates et al., "Learning to solve np-complete problems: A graph neural network for decision tsp". In Proceedings of the AAAI Conference on Artificial Intelligence, vol. 33, pp. 4731-4738, 2019.

Rajeev et al., Genetic algorithms—based methodologies for design optimization of trusses. Journal of structural engineering, 123(3):350-358, 1997.

Sanchez-Gonzalez et al., "Graph networks as learnable physics engines for inference and control". arXiv preprint arXiv:1806. 01242, 2018.

Sanchez-Gonzalez et al., "Learning to simulate complex physics with graph networks". arXiv preprint arXiv:2002.09405, 2020.

Tamura et al., "Machine learning for combinatorial optimization of brace placement of steel frames". Japan Architectural Review, 1(4):419-430, 2018.

Tian et al., "Learning to infer and execute 3d shape programs". arXiv preprint arXiv:1901.02875, 2019.

Torky et al., "A deep learning approach to automated structural engineering of prestressed members". 2018.

Veličković et al., "Graph attention networks". arXiv preprint arXiv:1710. 10903, 2017.

Watters et al., "Visual interaction networks: Learning a physics simulator from video". In Advances in neural Information processing systems, pp. 4539-4547, 2017.

Wu et al., "A comprehensive survey on graph neural networks". IEEE Transactions on Neural Networks and Learning Systems, vol. 32, No. 1, 2021, pp. 4-24.

Xu et al., "How powerful are graph neural networks?" arXiv preprint arXiv:1810.00826, 17 pages, 2018.

You et al., "Graph convolutional policy network for goal-directed molecular graph generation". In Advances in neural information processing systems, pp. 6410-6421, 2018.

You et al., "Position-aware graph neural networks". arXiv preprint arXiv:1906.04817, 2019.

Zheng et al., "Strokenet: A neural painting environment". 12 pages, 2018.

Zhou et al., "Graph neural networks: A review of methods and applications". AI Open 1, pp. 57-81, arXiv preprint arXiv:1812. 08434, 2020.

* cited by examiner

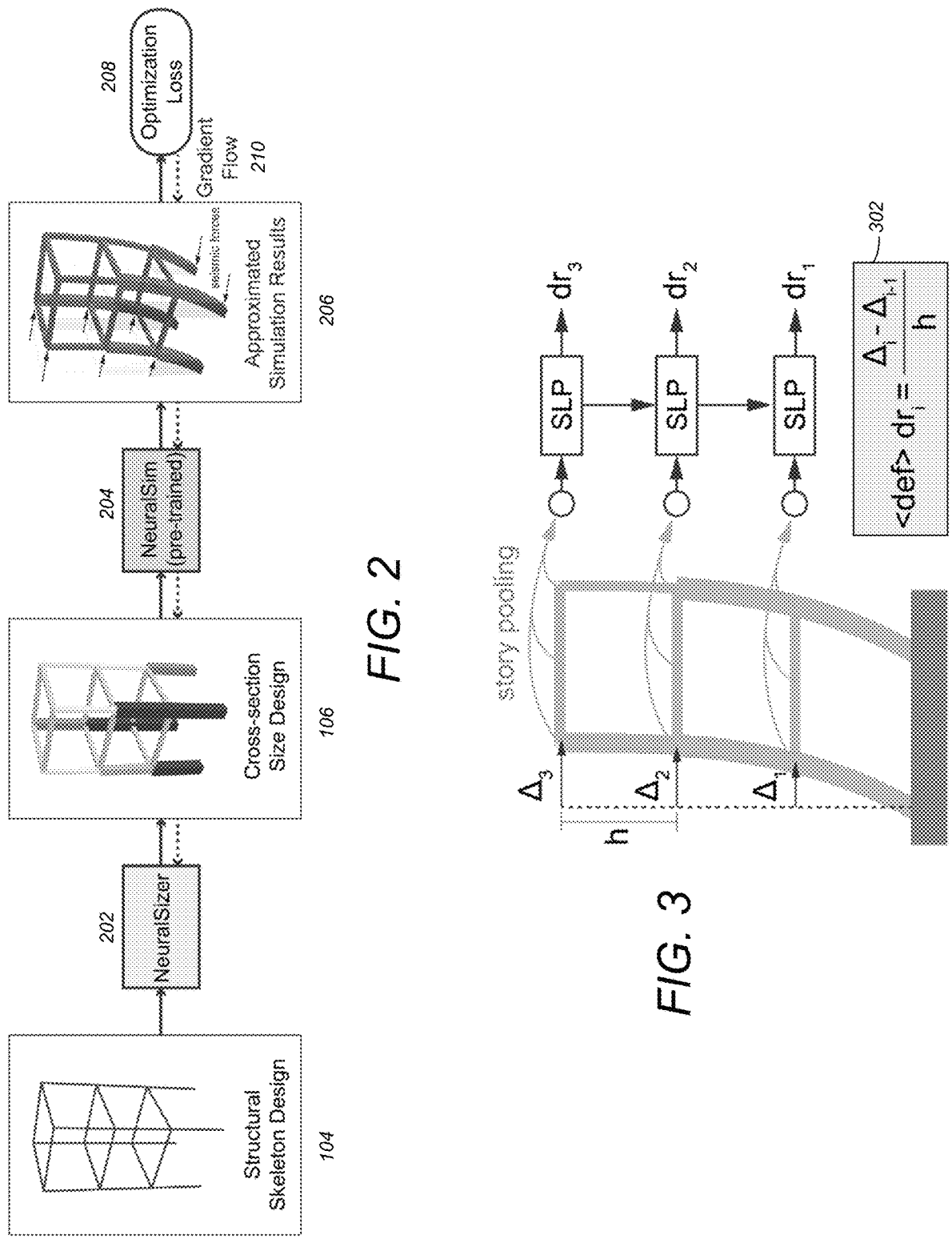

| Experiment | Mass Tonnage | Beam Usage | Column Usage | Drift Ratios in Seismic X (Limit = 0.025) | | | | Drift Ratios in Seismic Y (Limit = 0.025) | | | |
|---|---|---|---|---|---|---|---|---|---|---|---|
| | | | Human | Story 1 | Story 2 | Story 3 | Story 4 | Story 1 | Story 2 | Story 3 | Story 4 |
| Iteration 1 | 422.06 | 188, 0, 0, 0, 0, 0, 0, 0 | 62, 62, 0, 0, 0 | 0.0209 | 0.0174 | 0.0015 | 0.0084 | 0.0207 | 0.0173 | 0.0149 | 0.0093 |
| Iteration 2 | 432.47 | 188, 0, 0, 0, 0, 0, 0, 0 | 124, 0, 0, 0, 0 | 0.0213 | 0.0178 | 0.0128 | 0.0084 | 0.0211 | 0.0177 | 0.0134 | 0.0083 |
| Iteration 3 | 279.41 | 0, 0, 0, 0, 0, 0, 0, 188 | 62, 62, 0, 0, 0 | 0.0098 | 0.0073 | 0.0048 | 0.0063 | 0.0096 | 0.0072 | 0.0048 | 0.0058 |
| Iteration 4 | 261.86 | 0, 0, 0, 0, 0, 0, 0, 188 | 0, 0, 0, 0, 124 | 0.0092 | 0.0078 | 0.0113 | 0.0118 | 0.0091 | 0.0077 | 0.0101 | 0.0119 |
| Iteration 5 | 267.95 | 47, 0, 47, 0, 0, 0, 0, 47 | 0, 0, 0, 0, 124 | 0.0093 | 0.0082 | 0.0113 | 0.0119 | 0.0091 | 0.0081 | 0.0091 | 0.0119 |
| Objective Weight 10 | | 0, 0, 0, 0, 0, 0, 0, 188 | 75, 75, 74, 0 NeuroStzer | 0.0096 | 0.0072 | 0.0049 | 0.0060 | 0.0096 | 0.0090 | 0.0146 | 0.0081 |

FIG. 11

LEARNING TO SIMULATE AND DESIGN FOR STRUCTURAL ENGINEERING

CROSS-REFERENCE TO RELATED APPLICATIONS

This application claims the benefit under 35 U.S.C. Section 119(e) of the following commonly-assigned U.S. provisional patent application(s), which is/are incorporated by reference herein:

Provisional Application Ser. No. 62/988,845, filed on Mar. 12, 2020, with inventor(s) Kai-Hung Chang, Chin-Yi Cheng, and Mehdi Nourbakhsh, entitled "Learning to Simulate and Design for Structural Engineering,".

BACKGROUND OF THE INVENTION

1. Field of the Invention

The present invention relates generally to building design, and in particular, to a method, apparatus, system, and computer program product for automating the structural design process.

2. Description of the Related Art (Note: This application references a number of different publications as indicated throughout the specification by a name and year enclosed in brackets, e.g., [Rajeev 1997]. A list of these different publications ordered according to these names and years can be found below in the section entitled "References." Each of these publications is incorporated by reference herein.)

A primary goal for the structural design of buildings is to design the optimal structures subject to a design objective, such as minimizing material usage for cost and sustainability reasons. The design also has to satisfy a set of rules from established standards known as building codes, for example, a limited displacement under loading and seismic force. However, most structural engineers do not employ optimization in real-world cases for several reasons. First, the design space is large. A classic five-story building has typically over 500 columns and beams as design variables. Moreover, optimization algorithms usually require many iterations, and the evaluation for each optimization iteration takes two (2) to fifteen (15) minutes to runstructural simulation. As a result, a single optimization process can take days to converge, which does not fit the need for frequent design changes in a construction project. In practice, the majority of structural engineers complete structural designs with trial-and-error. After getting simulation results from a proposed design, structural engineers have to revise the design iteratively until all the building codes are satisfied. Since finding a valid design is already challenging and laborious, the outcome is usually over-designed, which means it satisfies the code and constraints but has poor performance in the design objective.

Accordingly, what is needed is the ability to optimize a structural engineering design in an efficient and expeditious manner. To better understand the problems of the prior art, a description of structural optimization, graph neural networks (GNNs), and differentiable approximators for designs may be useful.
Structural Optimization Most structural engineering research solves building design optimization problems with evolutionary algorithms, such as genetic algorithms ([Rajeev 1997], [Balogh 2012], [Imran 2019]). These methods evaluate candidate solutions using a fitness function and iteratively evolve the solution population. The computational complexity is high due to the evaluation, especially with structural simulation tools. The latest studies that apply deep learning approaches use vector inputs to encode information of a structural component ([Greco 2018]; [Torky 2018]; [Cheng 2017]), a single structure ([Hasançebi 2013]), or 2D images to coarsely describe the structural geometry ([Tamura 2018]). These representations suffer from scalability and expressiveness and thus can hardly be applied to real-world cases.
Graph Neural Network Graph neural networks (GNNs) have shown great successes in many learning tasks that require graph data and are applied to many new scientific domains, including physics systems ([Kipf 2018]; [Sanchez-Gonzalez 2018]; [Watters 2017]), fluid dynamics ([Sanchez-Gonzalez 2020]), chemical molecules (Fout 2017]; [Jin 2018b]; [Do 2019]), and traffic networks ([Guo 2019]; [Cui 2019]). For readers who are unfamiliar with GNNs, recent reviews and tutorials exist ([Zhou 2018]; [Wu 2020]). Related to the structural engineering domain, ([Hamrick 2018]) uses reinforcement learning to train a graph neural network policy that learns to glue pairs of blocks to stabilize a block tower under gravity in a physics engine. However, the scale and the complexity of the tower (maximum of 12 blocks) are much smaller than real-world buildings.

Though some papers have applied GNNs to solve combinatorial optimization problems ([Bello 2016]; [Kool 2018]; [Prates 2019]; [Li 2018]), applying GNN to solve design optimization problems is underexplored. For molecular design optimization problems, both [Jin 2018a] and [You 2018] train GNNs to generate a new molecular graph that optimizes objectives subject to constraints. [Jin 2018a] trains a junction tree variational autoencoder to obtain the latent embedding of a molecular graph and iteratively revises the latent embedding based on a neural prediction model. Constraints on the revision similarity are later enforced over a population of the revised molecular graphs to find the one that has the best predicted property. Similar to [Hamrick 2018], [You 2018] also chooses a reinforcement learning approach and trains a graph convolutional policy network which outputs a sequence of actions to maximize the property reward. Compared to these two papers, embodiments of the invention train a NeuralSizer to directly propose cross-sections, and uses a NeuralSim as a differentiable simulator to provide a back-propagable loss.
Differentiable Approximator for Design Differentiable approximators are commonly used to model the non-differentiable loss function of interest and to provide gradients in back-propagation. Taking drawing tasks as an example, StrokeNet ([Zheng 2018]) and Canvas Drawer ([Frans 2018]) optimizes the unsupervised reconstruction loss with the aid of a differentiable renderer. The differentiable renderer models the relation between stroke actions and the output drawing. Given a target scene of 3D shapes, [Tian 2019] trains a neural program executer with a pre-trained scene generator, which maps the input code to the corresponding output scene. Outside of the image generation domain, [Zhou 2016] takes a model-based approach by training a hand pose generation model followed by a non-linear layer, which acts as a differentiable approximator for forward kinematics computation.

SUMMARY OF THE INVENTION

The structural design process for buildings is time-consuming and laborious. To automate this process, structural engineers combine optimization methods with simulation tools to find an optimal design with minimal building mass subject to building regulations. However, structural engineers in practice often avoid optimization and compromise on a suboptimal design for the majority of buildings, due to the large size of the design space, the iterative nature of the optimization methods, and the slow simulation tools. Embodiments of the invention formulate the building structures as graphs and create an end-to-end pipeline that can learn to propose the optimal cross-sections of columns and beams by training together with a pre-trained differentiable structural simulator. The performance of the proposed structural designs is comparable to the ones optimized by genetic algorithms (GA), with all the constraints satisfied. The optimal structural design with the reduced building mass can not only lower the material cost, but also decrease the carbon footprint.

BRIEF DESCRIPTION OF THE DRAWINGS

Referring now to the drawings in which like reference numbers represent corresponding parts throughout:

FIG. 2 illustrates the end-to-end learning pipeline for solving the size design optimization problem (including the use of the neural networks) in accordance with one or more embodiments of the invention;

FIG. 3 illustrates the definition of the drift ratio in accordance with one or more embodiments of the invention;

FIG. 11 illustrates a table of the user study results in accordance with one or more embodiments of the invention;

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Figure 1:
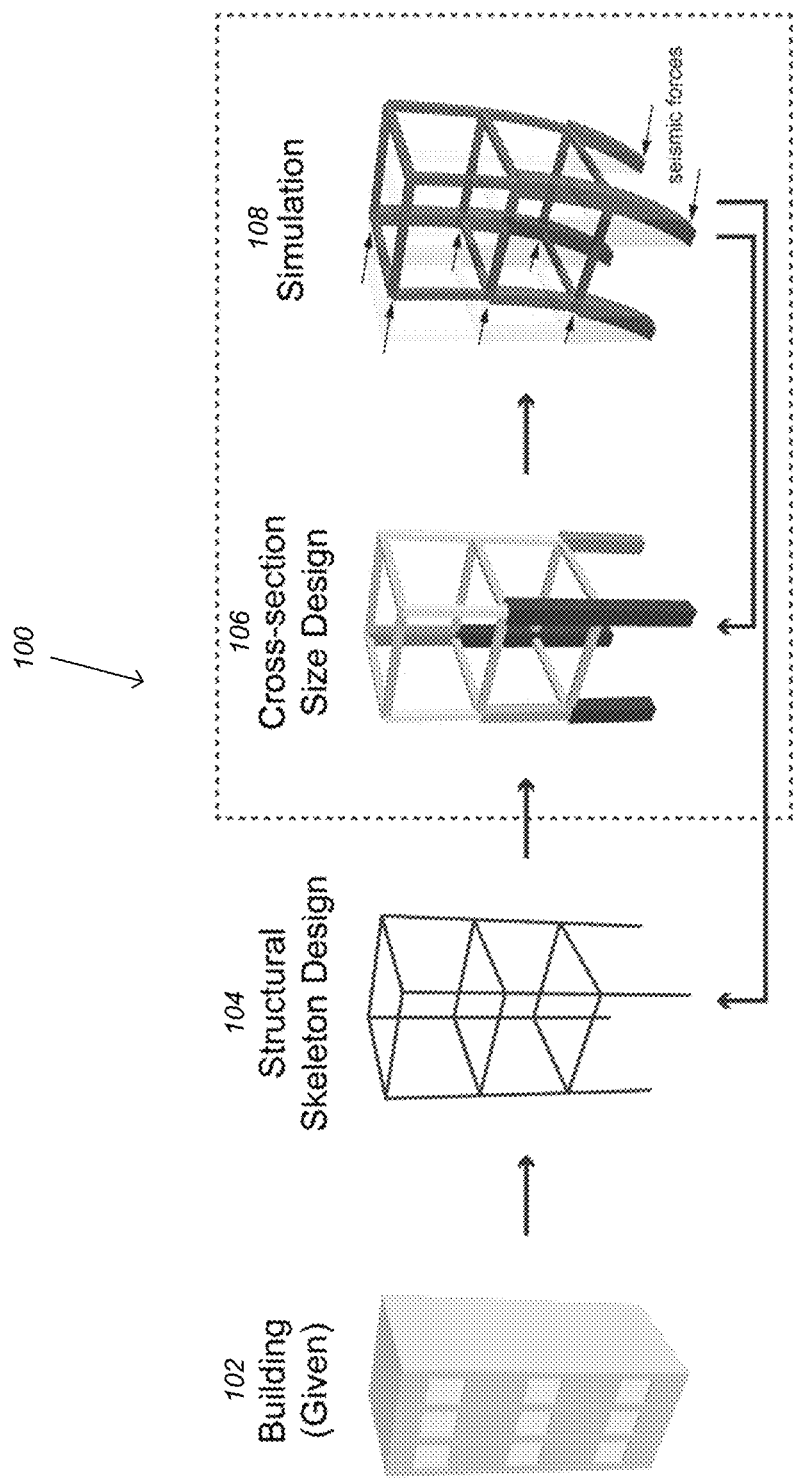
FIG. 1 illustrates the iterative industrial structural design workflow in accordance with one or more embodiments of the invention.

Embodiments of the invention provide an end-to-end solution to automate the structural design process. FIG. 1 illustrates the iterative industrial structural design workflow in accordance with one or more embodiments of the invention. A typical structural design process 100 starts from a given building design 102, and then the structural engineer will propose a skeleton design 104, where the locations and connectivities of columns and beams are defined. After proposing the skeleton 104, the engineer will decide the cross-section size for each bar (column and beam) 106. The engineer will then evaluate the design by running structural simulation 108 (e.g., simulating seismic forces) and update the skeleton 104 and cross-section sizes 106 iteratively. As a starting point, embodiments of the invention focus on automating the size design 106 as well as the structural simulation 108 process.

In embodiments of the invention, a building skeleton 104 can be naturally represented as a graph. Accordingly, embodiments include two graph neural networks, referred to herein as NeuralSim and NeuralSizer. FIG. 2 illustrates the end-to-end learning pipeline for solving the size design optimization problem (including the use of the neural networks) in accordance with one or more embodiments of the invention. NeuralSizer 202 is trained to assign the optimal cross-section sizes 106 to the given columns and beams and evaluate the size design using the pre-trained neural approximator, NeuralSim 204 (i.e., resulting in approximated simulation results 206), instead of using a real structural simulation tool 108. Taking advantage of the differentiable nature of NeuralSim 204, the gradient flow 210 of the optimization loss 208 can flow through NeuralSim 204 (e.g., and the approximated simulation results 206) and update the learning parameters in NeuralSizer 202. Results show that NeuralSizer 202 can produce a design comparable to the design generated by genetic algorithms running for a thousand (1000) iterations.

Formulation

Size Design Optimization Problem

In embodiments of the invention, the size design optimization problem is targeted in the structural design process. After structural engineers complete the skeleton design 104, they have to decide the cross-sections 106 for all the columns and beams, which directly impact the performance of the building, including the material usage, stability, constructability, etc. The size design optimization problem is formulated with the following objective and constraints:

Mass Objective: We want to minimize the total material mass of the building.

Drift Ratio Constraint: Building code regulations require a building to satisfy a set of constraints to ensure its stability and safety. FIG. 3 illustrates the definition of the drift ratio in accordance with one or more embodiments of the invention. The drift ratio constraint requires the drift ratios (dr) for each story i (visualized and defined in box 302) to be less than some limit under lateral seismic loads. Accordingly, the drift ratio constraint 302 is defined as the ratio of the relative lateral displacement (Δ) of a story to the story height (h).

The description below provides further details regarding how the drift ratio constraints are utilized in a model.

Variety Constraint: This constraint comes from the constructability requirement which sets a maximum number for different cross-section types used.

Using too many different cross-section types leads to higher manufacturing and transportation cost.

In most cases, using stronger columns or beams improves stability, but leads to a larger total mass. The optimal design should satisfy both constraints and have a minimal building mass. Mathematical equations for the objective and constraints are described below.

Data Generation

Due to the lack of real structural design data, a dataset is synthesized that contains building skeletons with randomly sampled cross-sections in real-world scale. Embodiments of the invention may utilize structural analysis software (e.g., AUTODESK ROBOT STRUCTURAL ANALYSIS (RSA)) that analyzes structural loads, verifies code compliance, and uses building information model (BIM) workflows to exchange data with other software applications (e.g. AUTODESK REVIT). More specifically, embodiments of the invention may utilize a structural simulator within structural analysis software, to compute the structural simulation results for a synthetic dataset. Various loads may be considered in the simulation: 1. Self-weight load of the building structure, 2. Surface loads on floor panels which are distributed to the underlying beams, 3. Surface loads on the roof story, and 4. Linear loads at the boundary beams for external walls. NeuralSim 204 is then trained with the building skeletons 104 with paired cross-sections 106 and simulated drift ratio. Details regarding the data generation are described below.

Representing Building Structures as Graphs

Figure 4:
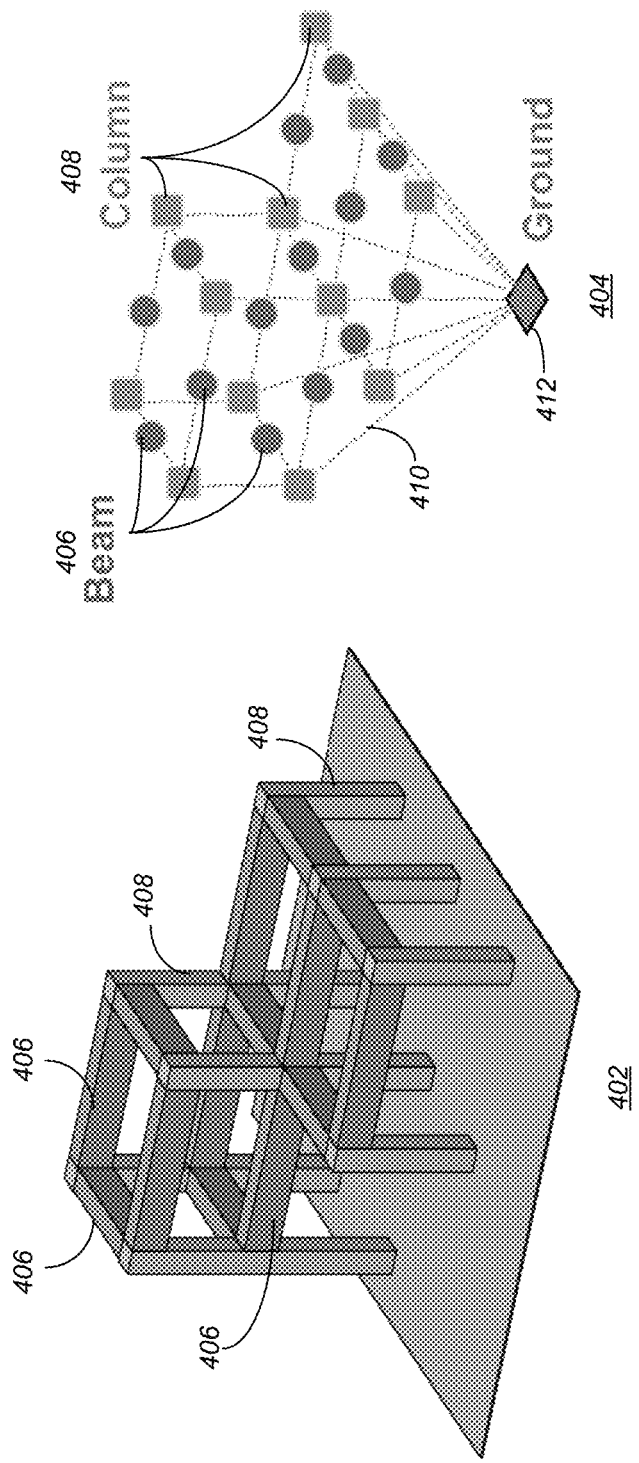
FIG. 4 illustrates an exemplary building structure and its structural graph representation in accordance with one or more embodiments of the invention.

One or more embodiments of the invention represent building geometries as structural graphs. FIG. 4 illustrates an exemplary building structure 402 and its structural graph representation 404 in accordance with one or more embodiments of the invention. Every bar (beam 406 or column 408) is represented as a graph node. An edge 410 connects two nodes if the two corresponding bars are joined together. Information of bar i is stored as a node feature $v_i=[p_1, p_2, B, T, L]$, where $p_1$ and $p_2$ locate the two endpoints of the bar, B indicates if the bar is a beam 406 or a column 408, T is a one-hot vector representing the cross-section, and L provides auxiliary loading condition information, including 1. if the bar is on the roof story, 2. if the bar is on the boundary, and 3. the surrounding floor penal areas which are multiplied by the per-area loads when computing the surface loads. A pseudo ground node 412 is connected to all first-story columns 408 and the values of its feature vector are all -1. Thus, FIG. 4 illustrates the structural graph 404 of a simple example structure. Story level indices of each bar may also be saved.

Graph Neural Networks

NeuralSim 204

Network Structure

Inspired by GraphNet ([Battaglia 2018]), NeuralSim 204 contains three steps: encoder, propagation, and decoder. The encoder first maps the input node features into the embedding space. Then, in the propagation step, each node embedding is iteratively updated based on the aggregated message, which is computed using the neighbor embeddings as well as the current node embedding. Embodiments may also utilize a model variant called NeuralSim+PGNN, which extends the message by integrating the position-aware message ([You 2019]). Though the classic message function can model the forces and reaction forces between bars, the position-aware message can further provide global information that helps identify loading conditions, such as if a bar is on the roof story or boundary. After a fixed number of propagation steps, the final embeddings of all nodes are obtained. Given the story indices, story embeddings are computed by pooling overall final embeddings of nodes in the same story.

Instead of using a standard multi-layer perceptron (MLP) as a decoder, embodiments of the invention may utilize a Structured Decoder (SD) for outputting drift ratios in each story. The illustration of a SD is visualized in FIG. 3. Starting from the roof story, SD updates each story embedding in the top-down order. The update module takes in the embedding of a story and the updated embedding of the above story to replace the current embedding. The design of SD is intended to mimic the algorithmic structure of the drift ratio's definition. Moreover, given the physics nature that the lower the story, the higher the story drift, the drift ratio in the same story will have different distributions if two buildings have different total numbers of stories. After updating the story embeddings, they are passed to two MLP decoders. One decoder outputs the predicted drift ratios ($dr_i$) while the other classifies if the ground-truth drift ratios exceed the drift ratio limit of 0.015 or not.

Loss

Given the two kinds of output from the decoders, the multi-task loss is defined as the sum of an L1 loss for the drift ratio output and a binary cross-entropy loss for the classifier output. Below is a description of the results in which it is shown that this multi-task loss helps NeuralSim 204 learn a better embedding.

Training

Embodiments of the invention may split the total 4000 data into 3200, 400, and 400 for training, evaluation, and testing purposes. An Adam Optimizer may then be used with a learning rate of 1 e–4 and a weight decay of 5 e–4. The batch size may be set to 1 and the number of epoch is 5.

NeuralSizer 202

Network Structure

A similar network structure (to that of NeuralSim 204) is adopted by NeuralSizer 202. NeuralSizer 202 has the same encoder and propagation step. A SD is not used since there isn't a strong bias in the size design. Instead, a graph embedding is computed to provide the information of the entire structure. In the end, an MLP decoder is used to map the final node embeddings concatenated by the graph embedding to the probability over cross-sections using a hard Gumbel Softmax function ([Jang 2016]). The hard version returns deterministic samples as one-hot vectors to ensure consistency of the NeuralSim inputs, but in back-propagation, the derivatives are calculated as if they are the soft samples.

Loss

Given the objective and constraints of the size design optimization problem described above, the losses are formulated as differentiable losses.

Mass Objective obj: The total mass of a bar is the product of its length, the area of its cross-section, and the material density. The length is derived from the two endpoint locations of the bar and we assume all bars are made of the same steel. The total mass is normalized by the number of bars in the structure.

Drift Ratio Constraint $l_{dr}$: This constraint requires the absolute value of all drift ratio $dr_i$ to be less than a limit lim. Therefore, we penalize the mean of how much the drift ratio in each story exceeds the limit:

$$l_{dr}=\text{Mean}\{\text{LeakyReLU}(|dr_i|-\text{lim})\}\leq 0$$

Variety Constraint $l_{var}$: The variety constraint penalizes the number of cross-section usages more than 6. We compute the usage percentage of each cross-section p and expect the sum of top 6 percentages to be 1. In other words, we can formulate the constraint as below:

$$l_{var}=1-\text{SumTop6}(p)=0$$

Entropy Constraint $l_H$: To avoid quick overfitting to some undesired local minimum, we introduce this entropy constraint inspired by maximal entropy reinforcement learning (RL) ([Haarnoja 2018]). Denote the entropy of Neural Sizer output of each bar as $H_i$, the maximum entropy over n different cross-sections $H_{max}$, and a target ratio $\alpha$=0.6. The entropy constraint is formulated as:

$$l_H=\text{Mean}\{H_i\}/H_{max}-\alpha=0$$

Without this entropy constraint, NeuralSizer 202 converges within 50 iterations in the experiment and always uses one cross-section type for all bars.

The total loss L equals $w_0\text{obj}+w_1 l_{dr}+w_2 l_{var}+w_3 l_H$. Instead of fine-tuning the weights $w_i$ manually, we automate the process by optimizing the dual objective and approximating dual gradient descent ([Boyd 2004]). This technique has shown successful results in soft actor-critic algorithms ([Haarnoja 2018]) and reward constrained policy optimization ([Achiam 2017]). A brief explanation of the method is described below.

Training

In each epoch, a new structural graph is randomly generated and fed to NeuralSizer 202 to get the design output. The output cross-sections are concatenated to the node embed-dings in the structural graph, which is passed to NeuralSim 204 for structural simulation. Given the design output and drift ratio output, the total loss is computed. NeuralSizer 202 updates based on the back-propagation gradients once every 5 epochs, and runs 50,000 epochs for training. Though having the best accuracy, NeuralSim+ PGNN has a much longer inference time than NeuralSim 204 due to the computation of the position-aware message. Therefore, we use a frozen pre-trained NeuralSim 204, which also shows high accuracy throughout the training.

EXPERIMENTS

All training and testing was run on a Quadro M6000 GPU.

NeuralSim 204 Results

NeuralSim 204 was compared to four other graph neural network models: GCN ([Kipf 2016]), GIN ([Xu 2018]), GAT ([Veličković 2017]), and PGNN ([You 2019]). Table 1 shows the L1 loss and the relative accuracy of the drift ratio output as well as the classification accuracy of the classifier output. NeuralSim 204 trained with the Structured Decoder (SD) outperforms GCN, GIN, GAT, and PGNN in all three metrics. Moreover, integrating the position-aware message from PGNN helps further improve the performance.

TABLE 1

NeuralSim Performance compared to Other Models

| Model | L1 Loss × 1e-4 | Relative Accuracy | Classification Accuracy |
|---|---|---|---|
| GCN | 16.01 | 94.86 | 89.22 |
| GIN | 33.85 | 89.62 | 84.27 |
| GAT | 10.87 | 96.41 | 93.35 |
| PGNN | 9.39 | 96.72 | 94.83 |

TABLE 1-continued

NeuralSim Performance compared to Other Models

| Model | L1 Loss × 1e-4 | Relative Accuracy | Classification Accuracy |
|---|---|---|---|
| NeuralSim | 7.57 | 97.36 | 95.64 |
| NeuralSim + PGNN | 5.01 | 98.22 | 96.43 |
| NeuralSim (no SD) | 10.24 | 96.65 | 92.71 |
| NeuralSim (only L1 loss) | 16.47 | 95.24 | n/a |

Ablation study results are also included in Table 1. NeuralSim 204 shows better performance when trained with SD since the imposed inductive bias of SD models the increasing drift ratios in lower stories. Moreover, adding the classifier output and the binary cross-entropy loss helps NeuralSim 204 learn a better embedding and thus improves the performance.

A plot of all learning curves is described further below. Training takes around 3.5 hours and a forward propagation of NeuralSim 204 for one design takes 6.789 milliseconds in average. Compared to our simulation software Autodesk RSA, which takes 13 seconds, NeuralSim is 1900 times faster with 97.36% accuracy. NeuralSim+PGNN takes 43.92 milliseconds, which is 300 times faster.

In Table 2, NeuralSim 204 demonstrates its generalizability to test data beyond the training scope. The test data is split into 3 buckets based on the numbers of stories: 1~3, 4~7, and 8~10 story. One model is trained with 1~10 story buildings while the other is trained with 4~7 story buildings. Both models are trained with the same amount of training data and tested against each bucket. The results in the first row show that the performance variation across different buckets is small. The second row demonstrates that NeuralSim 204 also performs well on extrapolated data. The learned message passing module in NeuralSim 204 models the physics of force propagation, which is universal across buildings of different numbers of stories. As a result, NeuralSim shows strong generalizability to extrapolated data.

TABLE 2

NeuralSim Generalizability Results

| Train Data | Test Data | L1 Loss × 1e-4 Accuracy | Relative Accuracy | Classification |
|---|---|---|---|---|
| 1~10 story (Baseline) | 1~3 story | 6.09 | 98.09 | 95.01 |
| | 4~7 story | 6.67 | 97.55 | 96.31 |
| | 8~10 story | 8.73 | 96.34 | 96.79 |
| 4~7 story | 1~3 story | 23.97 | 91.70 | 85.75 |
| | 4~7 story | 15.49 | 92.93 | 96.40 |
| | 8~10 story | 26.43 | 91.11 | 84.33 |

NeuralSizer 202 Results

Two scenarios are created. The high safety factor scenario has a drift ratio limit 0.015 while the low safety factor scenario has a drift ratio limit 0.025. For each scenario, two experiments are conducted with different weights on the mass objective. Table 3 summarizes the results of all experiments. All constraints are close to zero, indicating that Neural Sizer 202 learns to satisfy the hard constraints. In particular, the drift ratio constraint, which measures how much the drift ratio exceeds the limit, is negligible compared to the magnitude of drift ratios.

TABLE 3

NeuralSizer Results under Different Scenarios

| Scenario | Objective Weight | Objective Mass Objective | Constraints Drift Ratio Constraint | Variety Constraint |
|---|---|---|---|---|
| High Safety Factor | 1 | 0.870 | 6.00 × 1e−7 | 0.01 × 1e−8 |
|  | 10 | 0.735 | 1.34 × 1e−7 | 1.04 × 1e−8 |
| Low Safety Factor | 1 | 0.592 | 6.42 × 1e−5 | 1.67 × 1e−8 |
|  | 10 | 0.596 | 3.32 × 1e−5 | 1.78 × 1e−8 |

Figure 5:
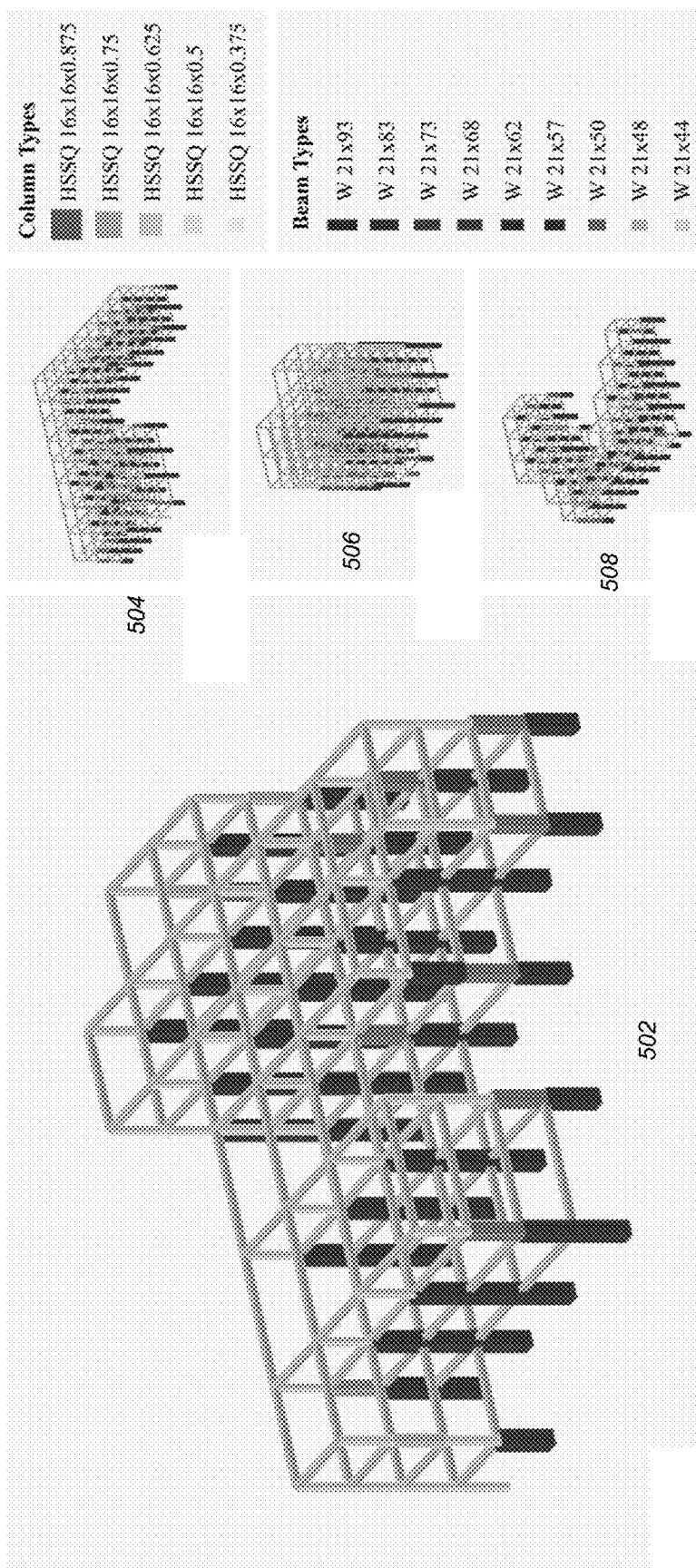
FIG. 5 illustrates the visualization of several design outputs from a NeuralSizer in accordance with one or more embodiments of the invention.

FIG. 5 illustrates the visualization of several design outputs 502, 504, 506, and 508 from a NeuralSizer 202 in accordance with one or more embodiments of the invention. Training takes around 2.5 hours and a forward propagation of Neural Sizer 202 for one design takes 10.07 milliseconds in average. To test the generalizability of NeuralSizer 202, the high safety factor scenario and an objective weight=10 were selected for an experiment. Again, two models (training with 1~10 story and 4~7 story buildings) were compared and the performance of three test buckets (1~3, 4~7, and 8~10 story buildings) were measured. The results are summarized in Table 4. Both models satisfy the constraints well and show similar performances across the three different buckets. NueralSizer 202 trained with 4~7 story buildings also shows generalizability to buildings with more and less numbers of stories than the training range.

TABLE 4

NeuralSizer Generalizability Results
High Safety Factor, Objective Weight = 10)

| Train Data | Test Data | Objective Mass Objective | Constraints Drift Ratio Constraint | Variety Constraint |
|---|---|---|---|---|
| 1~10 story (Baseline) | 1~3 story | 0.738 | 1.62 × 1e−7 | 0.80 × 1e−8 |
|  | 4~7 story | 0.725 | 1.28 × 1e−7 | 0.97 × 1e−8 |
|  | 8~10 story | 0.711 | 1.69 × 1e−7 | 1.06 × 1e−8 |
| 4~7 story | 1~3 story | 0.773 | 2.96 × 1e−7 | 1.30 × 1e−8 |
|  | 4~7 story | 0.746 | 3.50 × 1e−7 | 1.25 × 1e−8 |
|  | 8~10 story | 0.728 | 3.68 × 1e−7 | 1.01 × 1e−8 |

User Feedback and User Study

FIG. 5 visualizes the design outputs 502-508 of NeuralSizer 202 (high safety factor+objective weight 10) for various buildings. A cross-section with stronger structural properties is visualized in a darker color and a thicker stick.

To understand the quality from a professional perspective, 10 different designs were shown to structural engineers and feedback was requested. The structural engineers responded that the cross-section choices looked natural to them, except that the design was too sophisticated as they usually assign the same cross-sections in groups. Interestingly, structural engineers revealed some of the design rules that NeuralSizer 202 reasons and learns and that they think are reasonable. These rules are listed and explained below.

During an earthquake, columns must support vertical gravity loads while undergoing large lateral displacements. Therefore, to satisfy the drift ratio constraint, NeuralSizer 202 learns to distribute masses on columns more than beams.

Since gravity loads are carried down the building structure, the loads accumulate and increase on lower stories. Columns for lower stories have a higher strength requirement than for higher stories. This can also be observed from NeuralSizer's design outputs.

It is reasonable to have similar patterns in design outputs of different buildings. Given the objective and constraints in the optimization problem, structural engineers will probably design with similar patterns.

User testing was also conducted to compare results of embodiments of the invention with the human design process. Given a building and thirty (30) minutes, a structural engineer tries five design iterations. The first three iterations are able to satisfy all the constraints while the fourth and the fifth cannot. The best out of the three valid designs is used to compare with NeuralSizer 202 results. The result shows NeuralSizer's design output has a better performance. The quantitative user testing results are described below. The goal of this testing is not to show NeuralSizer 202 can replace professional structural engineers, but to show that NeuralSizer 202 can speed up the iterative design process by providing a better starting point.

Comparison with Genetic Algorithm (GA)

Ga Setup

In this subsection, the method of embodiments of the invention are compared with the genetic algorithm (GA), which is a widely-used algorithm in the structural optimization research. GA contains six steps:

1. Initialization: To start GA, a population of 100 candidate solutions is generated. A candidate has a chromosome which encodes the cross-sections in genes.
2. Evaluation: The score of each candidate is computed as measured by the total loss equation. The same initial weights for individual losses are used as when training NeuralSizer 202, except they are now fixed.
3. Selection: The top five candidates are directly passed to the next generation without crossover and mutation.
4. Crossover: A selection mechanism is used that random samples two candidates and outputs the better one, called selected candidate. With a crossover rate of 0.9, this selected candidate pairs with another selected candidate to breed a children candidate using crossover operation; otherwise, the selected candidate becomes the children candidate. In total, ninety-five children candidates are generated for the next population.
5. Mutation: The genes in the ninety-five children candidates have a probability of 0.01 to randomly change to a different cross-section. After the mutation process, the ninety-five children candidates and the top five candidates form a new population for the next generation.
6. Termination: The iteration process is terminated after a certain number of iterations or a limited amount of time.

GA Time Comparison

In the evaluation step, computing scores requires running simulation tools, which is time-consuming. However, by replacing simulation tools with NeuralSim, the running time of GA is reduced. Table 5 lists running times of GA solving a building with 622 bars under different setups. NeuralSizer 202 outputs a design within 10.07 milliseconds. If GA candidates with AUTODESK RSA (GA+RSA) are evaluated, 30 iterations can be run in 24 hours. By estimation, it will take up to 2 weeks to finish 1000 iterations. However, if NeuralSim 204 is used for evaluation (GA+NeuralSim), it only takes around 30 minutes to complete 1000 iterations.

TABLE 5

Time Comparison of GA under Different Setups

| Setup | Time | Total Iterations | Time/Iteration |
|---|---|---|---|
| NeuroSizer | 10.07 ms | — | — |
| GA + RSA | 24 hr | 30 | — |
à (estimated) | 2 weeks | 1000 | 20.16 mins |
| GA + NeuralSim | 30 mins | 1000 | 0.03 mins |

Using Neuralsizer Outputs as GA Seeds

Testing first ran GA+NeuralSim with random seeds for 1000 iterations as a baseline. Due to the stochastic nature of GA, 10 runs were executed and the result that has the minimal total loss was saved. Next, the NeuralSizer 202 output was used as GA seeds. Since NeuralSizer 202 outputs the probability of cross-sections, there are two seeding strategies: best seed and sampled seeds. Best seed finds the best design output based on the highest probability and populates it to the initial population. On the other hand, sampled seeds sample from the probability to generate different seeds as the initial population. GA+RSA runs were also performed for 24 hours each with random seeds and sampled seeds.

Figure 6:
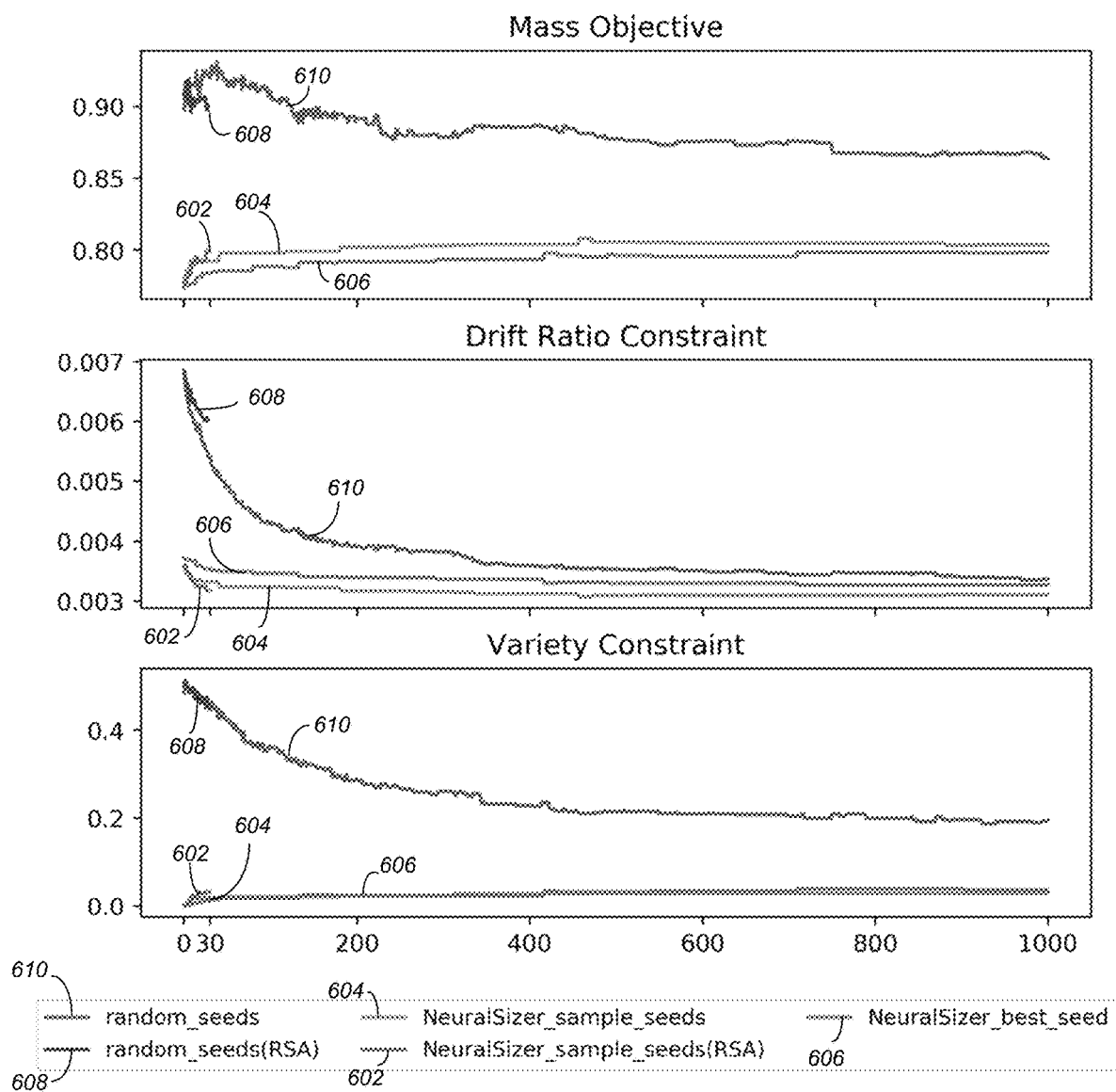
FIG. 6 plots the performance curves of GA using different seeding approaches in accordance with one or more embodiments of the invention.

FIG. 6 plots the performance curves of GA using different seeding approaches. All curves of GA using NeuralSizer 202 seeds (curves 602, 604, and 606) show lower losses (compared to that or random seeds 608-610) at the beginning of GA. Moreover, after running the same number of iterations, curves starting with NeuralSizer 202 seeds end up in better solutions than those starting with random seeds. However, the difference between using best seed 606 and sampled seeds 602-604 is little.

To quantitatively measure the performance across different designs, GA was run with NeuralSizer 202 using sampled seeds and random seeds (once for each) over 20 different designs. Three metrics are defined and illustrated in FIG. 7 as described below.

Figure 7:
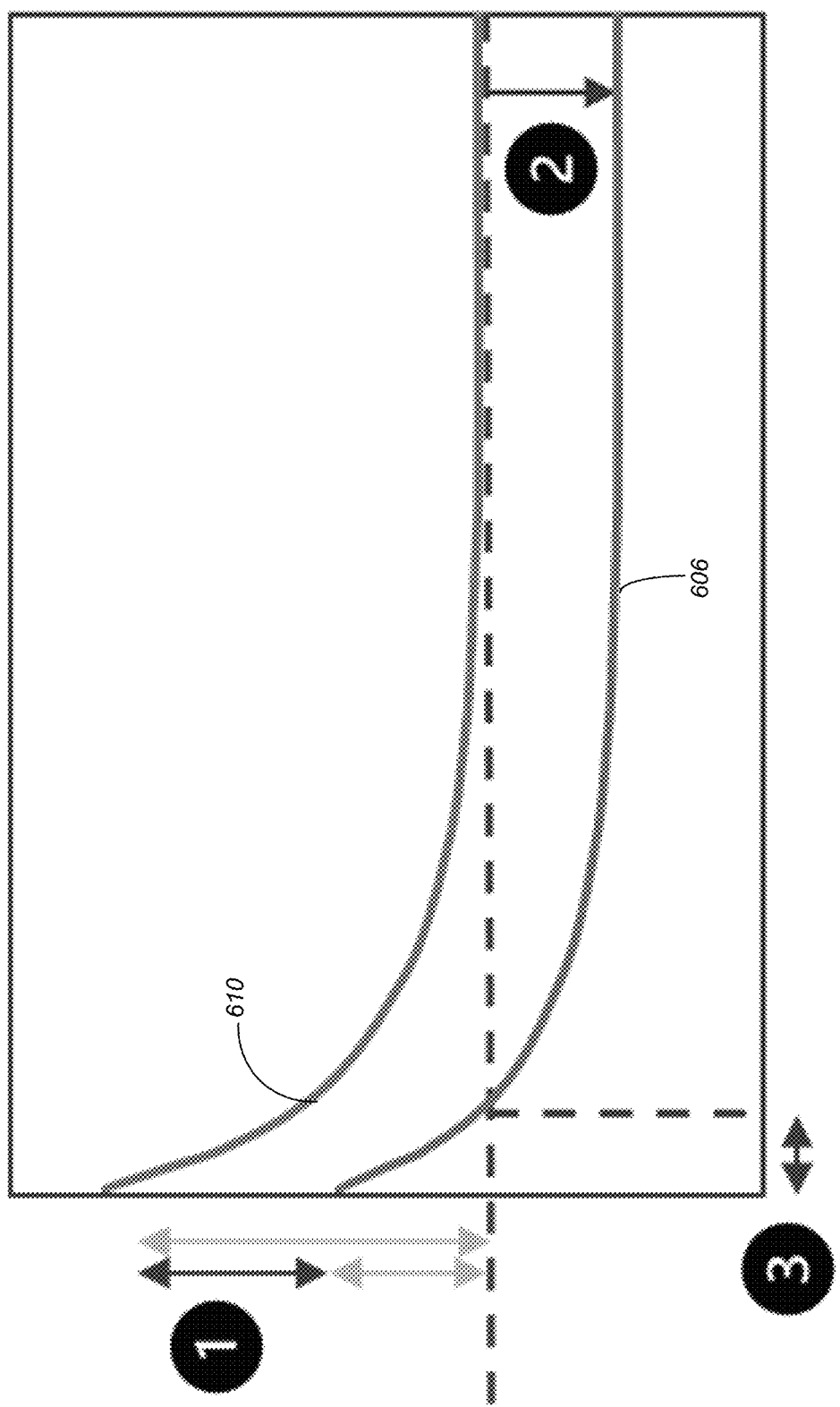
FIG. 7 illustrates exemplary quantitative metrics that measure the performance across different designs in accordance with one or more embodiments of the invention.

For GA using random seeds 610, the starting and ending losses are denoted as (rand_start, rand_end). Likewise, for GA using NeuralSizer 202 sampled seeds 606, they are denoted as (sizer_start, sizer_end). In FIG. 7, the enumerated numbers below are represented in darkened circles.

$$M_1 = \frac{(\text{rand\_start} - \text{sizer\_start})}{(\text{rand\_start} - \text{rand\_end})} \quad 1$$

The metric measures the percentage of improvement gained by initializing GA with NeuralSizer 202 sampled seeds. If M1 is larger than 100%, it means that the best performance of the NeuralSizer 202 sampled seeds at iteration 0 beats the best performance of GA with random seeds at iteration 1000.

$$M_2 = \frac{(\text{rand\_end} - \text{sizer\_end})}{(\text{rand\_end})} \quad 2$$

The metric compared the best performances between GA with NeuralSizer 202 sampled seeds and random seeds, both at 1000 iterations. A positive M2 indicates that the final performance of GA with NeuralSizer 202 sampled seeds is better.

3. $M_3$ is the first iteration when sizer_start is less than rand_end. Note that $M_3=0$ whenever $M_1>100\%$.

The quantitative results are summarized in Table 6. From $M_1$ results, we can see that some performance of NeuralSizer 202 seeds are almost the same as the best performance of GA with random seeds at iteration 1000, and some are even better. This proves that NeuralSizer 202 solves the size design optimization problem and that the results are comparable to GA. $M_2$ results show the capability of further optimizing the NeuralSizer 202 output to obtain solutions which are better than optimizing with random seed after the same amount of iteration. Lastly, the maximum of the six $M_3$ values in Table 6 is 128. Thus, compared to the total 1000 iterations, using NeuralSizer 202 seeds provide a speedup by at least 8 times.

TABLE 6

NeuralSizer Seeding Performance

| Metric | Mass Objective | Drift Ratio Constraint | Variety Constraint |
|---|---|---|---|
| High Safety Factor | | | |
| 1 | 232.60% | 115.30% | 186.20% |
| 2 | 7.43% | 25.70% | 95.82% |
| 3 | 0 | 25.6 | 0 |
| Low Safety Factor | | | |
| 1 | 83.15% | 95.35% | 156.22% |
| 2 | 4.16% | 49.22% | 32.53% |
| 3 | 128 | 0 | 0 |

Data Collection

This section describes the data collection process in detail. All unit abbreviations are listed in Table 7. Embodiments of the invention may adopt the same beam spans, materials, cross-sections, and load cases used by a structural design company.

TABLE 7

Unit Abbreviation

| Abbreviation | Full Unit |
|---|---|
| ft | Foot |
| pcf | Pound per cubic foot |
| psf | Pound per square foot |

Skeleton 104 Creation

Building skeleton 104 are created by a fixed sampling algorithm due to the deficiency of real-world data. Each building is erected on a rectangular base which edges are sampled between 60 ft. to 400 ft. A grid is created on the base and the intervals are sampled from the set of beam spans, ranging from 28 ft to 40 ft. A connected layout is sampled from the grid using depth-first-search algorithm which expands to neighboring grid cells with 0.5 probability. The same layout is vertically stacked up to 10 stories to form a voxel-like building geometry. Each voxel contains four columns on four vertical sides and four beams which form a rectangle frame on the top to support the floor panel. The story height is fixed at 16 ft.

Structural Simulation Model in RSA

Given the geometry of the building structure, we can create the corresponding structural simulation model (i.e., NeuralSim 204) in AUTODESK ROBOT STRUCTURAL ANALYSIS (RSA), which is an industrial structural simulation software. All the columns on the first story are not pinned, but fixed to the ground. Materials for columns and beams are Steel A500-46 and Steel A992-50 respectively.

For each column and beam, the cross-section is randomly assigned from Table 8. 150 pcf concrete floor panels are modeled as slabs on trapezoid plates with other parameters given in Table 9. In the graph representation, we do not model joists (smaller beams arranged in parallel across two beams to support floor panels). Instead, each surface load is converted to concentrated loads at joist endpoints.

TABLE 8

Cross-Section Library

| Column | Beam |
|---|---|
| HSSQ 16 × 16 × 0.375 | W 21 × 44 |
| HSSQ 16 × 16 × 0.5 | W 21 × 48 |
| HSSQ 16 × 16 × 0.625 | W 21 × 50 |
| HSSQ 16 × 16 × 0.75 | W 21 × 57 |
| HSSQ 16 × 16 × 0.875 | W 21 × 62 |
|  | W 21 × 68 |
|  | W 21 × 73 |
|  | W 21 × 83 |
|  | W 21 × 93 |

TABLE 9

Floor Panel Specification

| Parameter Name | Value |
|---|---|
| h | 6.3 in |
| h1 | 2.56 in |
| a | 7.4 in |
| a1 | 1.73 in |
| a2 | 4.96 in |
| Th | 7.46 in |
| Th 1 | 8.86 in |
| Th 2 | 6.3 in |
| Joist Direction | Parallel to the shorter edge |
| Material | Concrete |
| Material Resistance | 3.5 ksi |
| Material Unit Weight | 0.15 kip/ft3 |
| Diaphragm | Rigid |
| Load Transfer | Simplified one way |
| Finite Element | None |

For each floor panel, three joists are placed across the longer edges.

Load Cases Setup

IBC 2000 is the building code used for structural simulation. Below lists all the load cases:

1. Self-Weight: This is the self-weight load acting in the gravitational direction for all structure elements. The coefficient is set to 1.1.
2. Super-Imposed Dead Load: Super-imposed dead load accounts for the static weight of the non-structure elements. Here, we add 24 psf surface loads to all floor panels except the roof.
3. Live Load: Live load refers to the load that may change over time, such as people walking around. We consider 100 psf surface loads on all floor panels except the roof.
4. Roof Live Load: Roof live load is set as 20 psf surface load, different from the live load on other stories.
5. Roof Dead Load: We assign 15 psf surface load for non-structure elements on roof panels.
6. Cladding Load: 20 psf16 ft (story height)+90 lb/ft=410 lb/ft line load is added to all boundary beams on each story for self-weights of cladding walls.
7. Modal Analysis: Modal analysis determines eigenvalues (eigen-pulsations, eigen-frequencies, or eigen-periods), precision, eigen-vectors, participation coefficients and participation masses for the problem of structural eigen-vibrations. The number of modes is set to 30.
8. Seismic X: Seismic loads are automatically computed by RSA given the building code. We consider seismic loads in two directions: X and Y. Settings of seismic loads are listed in Table 10. Seismic X refers to the seismic loads in direction X.
9. Seismic Y: This is the seismic loads in direction Y.
10. Static Load Combination: Load combination linearly combines multiple load cases. Static load combination is defined as 1.2 D+1.6 L+0.5 $L_r$, where D is the sum of dead loads (1+2+5+6), L is the live load (3), and $L_r$ is the roof live loads (4).
11. Seismic Load Combination X: Complete quadratic combination (CQC) method is used for seismic load combination. This is defined as 0.9 D+1.0 $E_x$, where $E_x$ is the Seismic X load (8).
12. Seismic Load Combination Y: This is defined as 0.9 D+1.0 $E_y$, where $E_y$ is the Seismic Y load (9).

Saved Results

After running the structural simulation, all drift ratios in direction X and Y may be saved for Seismic Load Combination X and Y load cases respectively. The components of the drift ratios perpendicular to the seismic load directions are relatively small compared to the drift ratio limit. The drift ratio distribution is normalized to [1, 1].

TABLE 10

Seismic Parameters

| Parameter Name | Value |
|---|---|
| Site Class | D |
| S1 (Acceleration parameter for 1-second period) | 0.6 |
| Ss (Acceleration parameter for short periods.) | 1.8 |
| Ie (Importance factor) | 0.0 |
| Load to mass conversion for dead load | 1.0 |
| Load to mass conversion for live load | 0.1 |
| Load to mass conversion for roof live load | 0.25 |

Statistics

Figure 8A:
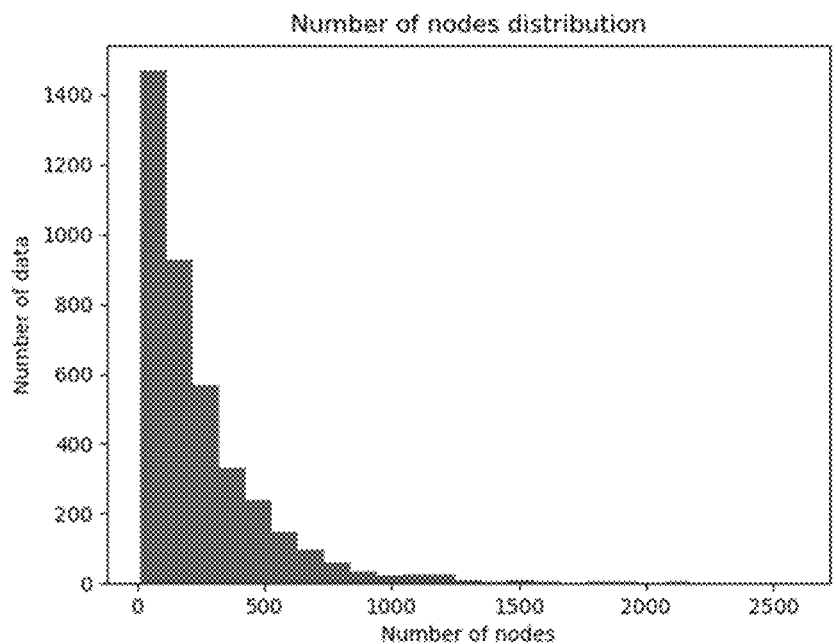
FIGS. 8A and 8B illustrate the statistics of the collected 4000 building structural graphs in accordance with one or more embodiments of the invention.
Figure 8B:
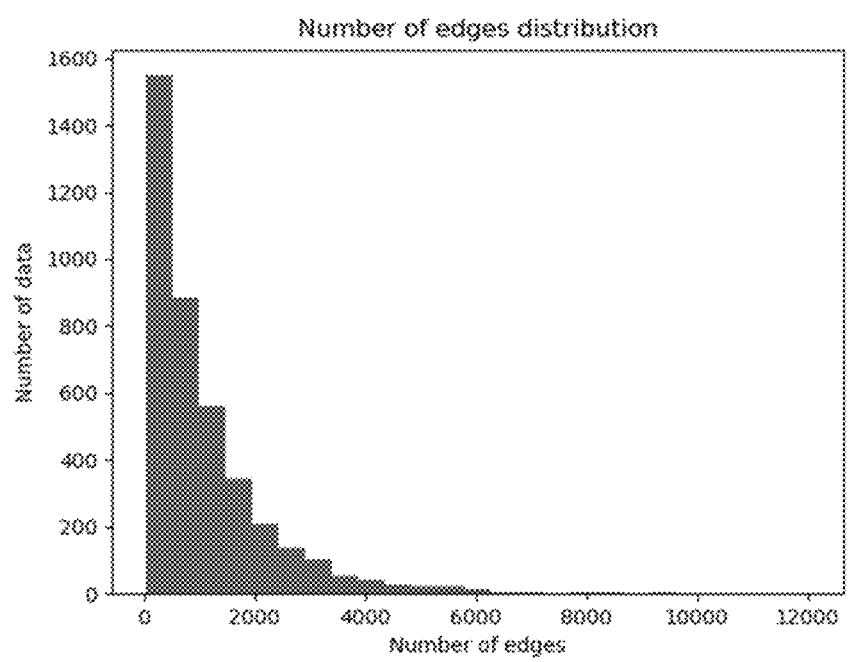
Figure 9A:
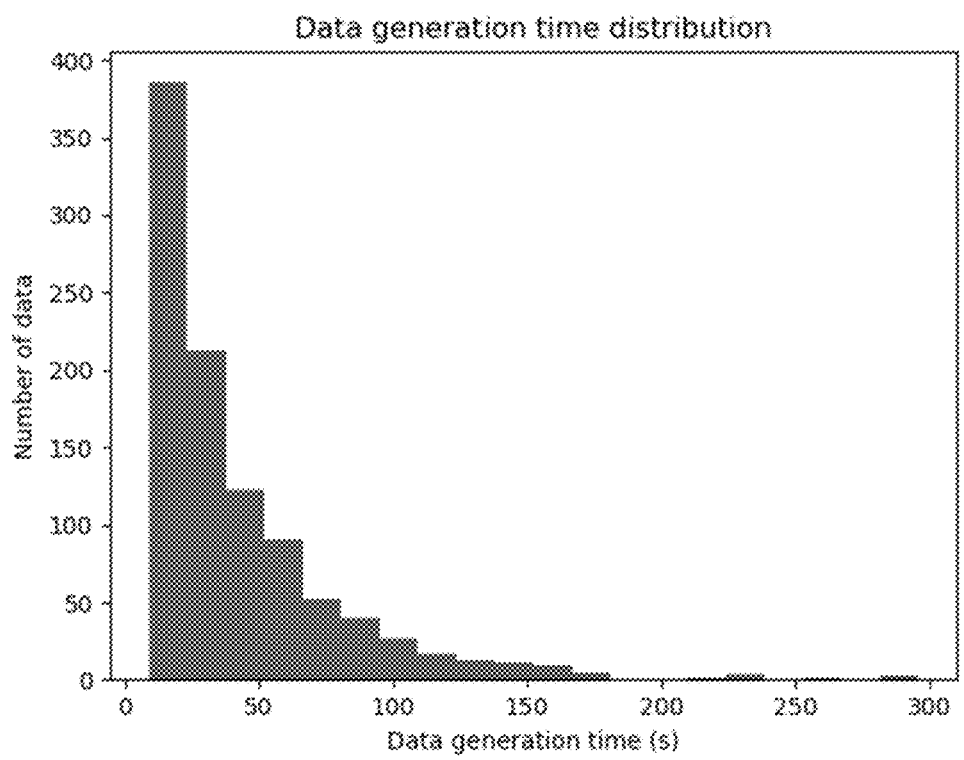
FIGS. 9A and 9B illustrate the statistics of 4000 collected structural graphs in accordance with one or more embodiments of the invention.
Figure 9B:
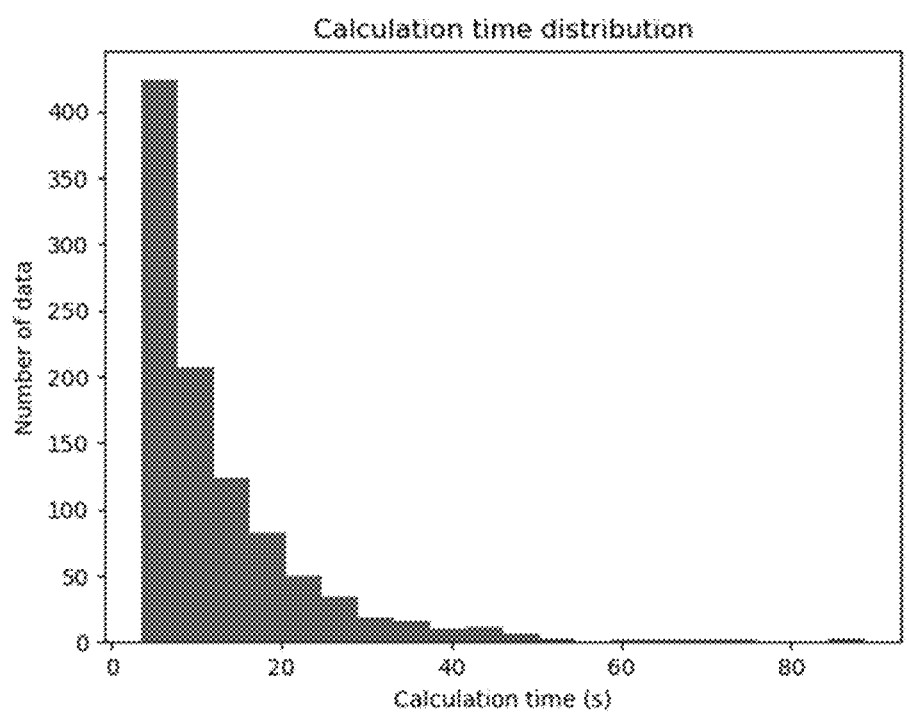

FIGS. 8A and 8B illustrate the statistics of the collected 4000 building structural graphs. More specifically, FIG. 8A illustrates the number of nodes distributed while FIG. 8B illustrates the number of edges distributed. FIGS. 9A and 9B illustrate the statistics of 4000 collected structural graphs. More specifically, FIGS. 9A and 9B plot two histograms: one for the times to generate one datum (i.e., the data collection time distribution) and the other for the calculation times spent on solving each structural simulation (i.e., the calculation time distribution for solving structural simulations).

Model Details

NeuralSim 204

The input node feature of bar i in a structural graph is de-noted as $v_i \in \mathbb{R}^{19}$. A single layer perceptron (SLP) encoder first maps each node feature to embedding $v_i^0 \in \mathbb{R}^{512}$.

$$v_i^0 = SLP_{encoder}(v_i) \quad (1)$$

To perform message-passing in the propagation step, we first compute aggregated messages then update each node feature. The superscript t denotes the propagation step and Ne (i) denotes the neighbor set of node i.

$$m_i^t = \text{Mean}\{SLP_{message}(v_i^t, v_j^t) | j \in Ne(i)\} \quad (2)$$

$$mp_i^t = \text{Mean}\left\{SLP_{p\_message}\left(\left[v_i^t, \frac{1}{d(i,j)+1}v_j^t\right]\right)\right\} \quad (3)$$

$$j = \arg\max\{d(l,i)|l \in A\_\{s\}\}|\forall A\_\{s\}, s = 1 \ldots S\} \quad (4)$$

Equation 2 computes the aggregated message $m_i$ from neighbor nodes while Equation 3 computes the position-aware message $mp_i$ from the set of 512 anchor nodes $A_s$ $S=1 \ldots S$. $d(l,i)$ represents the geodesic distance between node l and i. For more detail about position-aware message, please refer to [You 2019]. Equation 4 updates each node embedding based on the current embedding and the messages. If position-aware message is not used, we drop $mp^t$ and change the input dimension of SLP update accordingly. In the end, we apply dropout function with 0.5 probability before the next propagation. In total, we run T=5 propagation steps.

Since NeuralSim 204 is generating per-story output, we compute the story embedding ok by average pooling all the embeddings in story k.

$$o_k = \text{AvgPool}(\{v^T\}|i \in \text{Story } k\}) \quad (5)$$

$$o_k \leftarrow SLP_{recursive}\{[o_k, o_{k+1}]\} \text{ for } k=K-1 \ldots 1 \quad (6)$$

The structured decoder is processed using Equation 6, where each story embedding is updated in the top-down order. In the end, the story embeddings are passed to two multi-layer perceptron (MLP) decoders: one predicts the drift ratios $h_k \in \mathbb{R}^2$ and the other classifies if the ground-truth drift ratios exceed the drift ratio limit lim=0.015 or not.

$$h_k = MLP_{decoder}(o_k) \quad (7)$$

$$c_k = \text{SigmoidMLP}_{decoder}(o_k) \quad (8)$$

The multi-task loss is constructed by adding the L1 loss and the binary cross-entropy (BCE) loss.

$$\text{Loss} = \frac{1}{K}\sum_{k=1}^{K}|h_k - \hat{h}_k| - w \times BCE(c_k, \hat{c}_k) \quad (9)$$

where h^k is the ground-truth drift ratio, c^k is 1 if h^k>lim, otherwise is 0, and w=1 is the weight balancing the two losses. NeuralSim 204 is trained with 5 epochs, batch size 1, and learning rate 1 e−4 using the Adam optimizer. NeuralSizer 202

The inputs of the NeuralSizer 202 are building skeleton geometries 104, which are represented as the same structural graphs except that the input node features $v_i \in \mathbb{R}^{10}$ now do not contain cross-sections. The encoder and propagation steps are the same as NeuralSim 204. Note that NeuralSizer 202 does not compute nor use position-aware message by virtue of a faster training time. After 5 steps of propagation, the graph embedding g is computed by MaxPooling all the node embeddings as below.

$$g = \text{MaxPooling}(v_i^T|\forall i) \quad (10)$$

Each node embedding together with the graph embedding is fed into an MLP decoder to generate one-hot vectors $y_i \in \mathbb{R}^9$ using a hard Gumbel-Softmax function. The decoder has leaky ReLU function with negative slope 0.01 and dropout function in each layer.

$$y_i = \text{GumbelSoftmax}(MLP_{decoder}(v_i^T, g)) \quad (11)$$

NeuralSizer 202 is trained with batch size 5 and learning rate 1 e−4 using Adam optimizer. 50,000 buildings are randomly sampled during training, and a fixed 500 data set is used for evaluation. The drop out probability is 0.5 and linearly decays to zero at the end of training.

Dual Gradient Descent

A general constrained optimization problem with an objective function $f(\theta)$ and an equality constraint $g(\theta)$ can be written as $$\min f(\theta) \text{ s.t. } g(\theta) = 0 \quad (12)$$

Changing the constrained optimization to the dual problem, we get the Lagrangian:

$$L(\theta,\lambda) = f(\theta) - \lambda g(\theta) \quad (13)$$

where $\lambda$ is the dual variable. Dual gradient descent alternates between optimizing the Lagrangian with respect to the primal variables to convergence, and then taking a gradient step on the dual variables. The necessity of optimizing the Lagrangian to convergence is optional under convexity. Both ([Haarnoja 2018]) and embodiments of the invention found updating one gradient step still works in practice. As a result, the primal and dual variables are iteratively updated by the following equations.

$$\theta^t = \theta + \beta(\nabla_\theta f(\theta) - \lambda \nabla_\theta g(\theta)) \quad (14)$$

$$\lambda^t = \lambda + \gamma g(\theta) \quad (15)$$

where $\beta$ and $\gamma$ are learning rates. Inequality constraints can also be formulated similarly.

As described herein, the total loss is $w_0 \text{obj} + w_1 l_{dr} + w_2 l_{var} + w_3 l_H$. The initial weights and their learning rates are listed in Table 115.

TABLE 11

Dual Gradient Descent Parameters

| Loss | Initial Weight | Learning Rate |
|---|---|---|
| Mass Objective | w0 = 1, 10 | n/a |
| Drift Ratio Constraint | w1 = 1e3 | γ1 = 1e−1 |
| Variety Constraint | w2 = 1.0 | γ2 = 5e−4 |
| Entropy Constraint | w3 = 1.0 | γ3 = 1e−3 |

Learning Curves for Neural Simulators

Figure 10A:
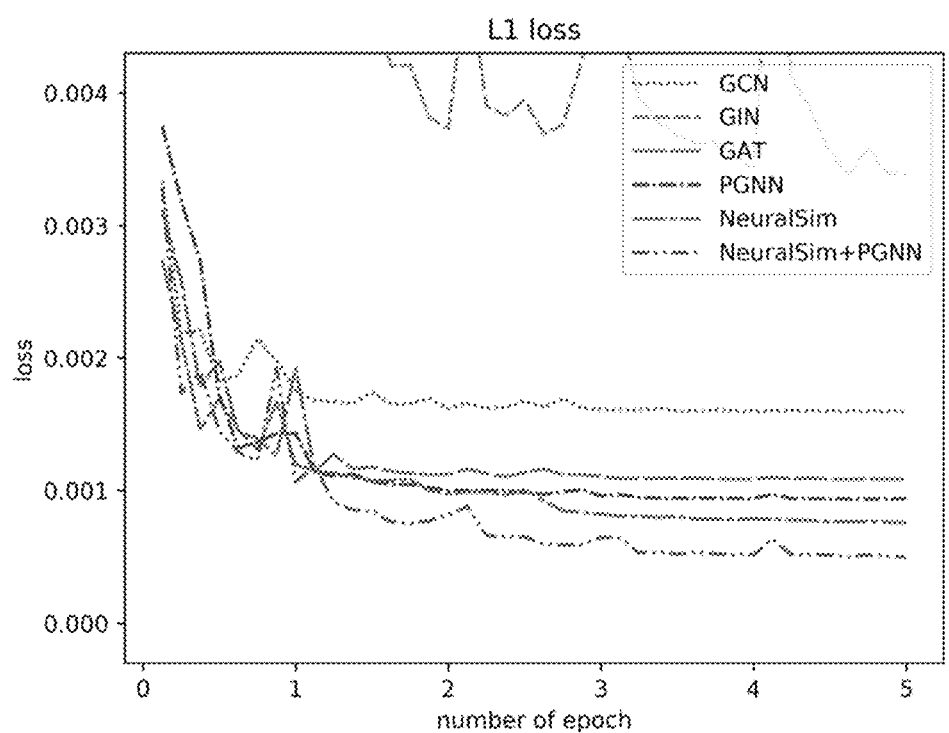
FIGS. 10A and 10B plot the learning curves of different models and ablation studies in accordance with one or more embodiments of the invention.
Figure 10B:
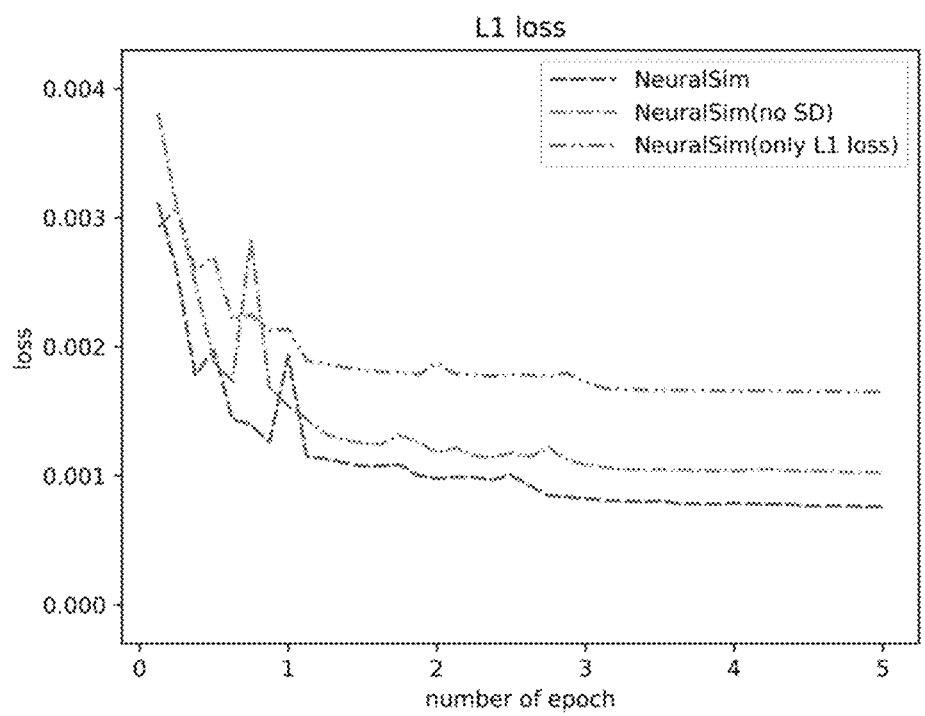

FIGS. 10A and 10B plot the learning curves of different models and ablation studies in accordance with one or more embodiments of the invention. More specifically, FIG. 10A illustrates the learning curves of different models (GCN, GIN, GAT, PGNN, NeuralSim, and SneuralSim+PGNN), while FIG. 10B illustrates the learning curves of ablation studies (NeuralSim, NeuralSim (no SD), and NeuralSim (Only L1 loss))

Additional User Study

Embodiments of the invention invited a structural engineer to work on a design in our user study and compare the human design with the design output from NeuralSizer 202. The structural engineer had 30 minutes to iterate on a 4-story building design following the manual design workflow. NeuralSizer 202 was also run to create one design. All designs were evaluated with respect to the mass objective, the drift ratio constraint (<0.025), and the variety constraint (<6). In 30 minutes, the structural engineer was able to create five iterations, and the evaluation results are presented in FIG. 11 (i.e., FIG. 11 illustrates a table of the user study results in accordance with one or more embodiments of the invention).

The beam and column usages are sorted in the descending order of strength. Using stronger columns or beams lowers drift ratios, but leads to a larger total mass. The shaded row (i.e., the row for iteration 3 of the experiment) highlights the most light-weighted designs that satisfy all constraints created by the structural engineer and NeuralSizer 202. Darker shaded cells (i.e., rows 4 and 5 of the columns for Story 1 and Story 2 of both Drift Ratios) indicate that the drift ratio exceeds the limit.

Figure 12:
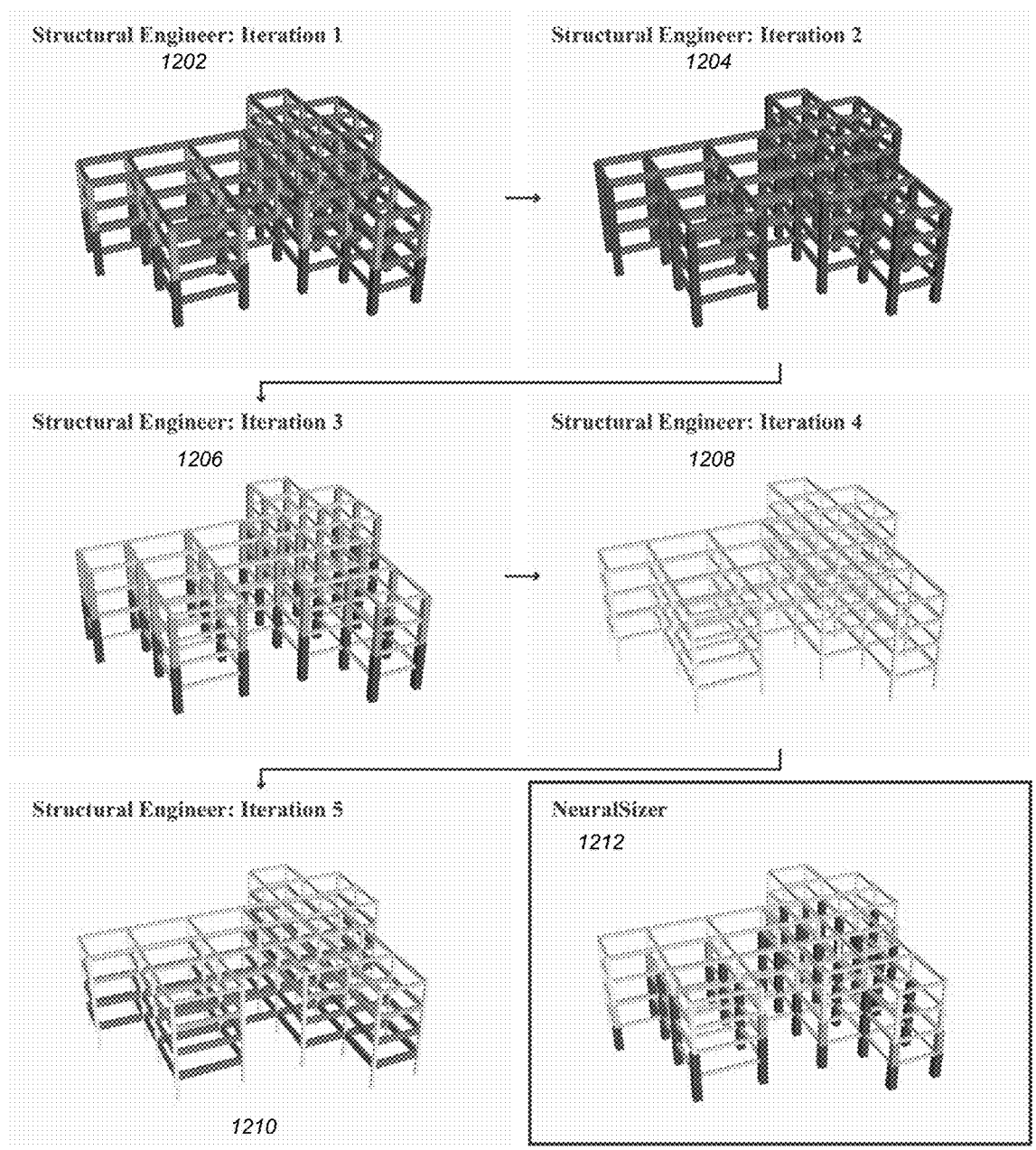
FIG. 12 illustrates a visualization of the NeuralSizer design and human designs in accordance with one or more embodiments of the invention.

FIG. 12 illustrates a visualization of the NeuralSizer design and human designs in accordance with one or more embodiments of the invention. In the first two iterations 1202 and 1204, the structural engineer prioritizes the constraint satisfaction by choosing two designs using mostly the strongest columns and beams. The simulation results of the first two designs provide not only a baseline, but also a vague idea about the relation between the cross-section decisions and the drift ratio changes. The third design 1206 is the first attempt to optimize the mass objective and has a significantly smaller mass. However, when the structural engineer tries to further decrease the mass in the fourth 1208 and fifth 1210 iteration, both designs violate the drift ratio constraint. Compared to the best human design in the third iteration 1206, NeuralSizer 1212 outputs a design that has a lower mass while satisfying the constraints. Note that the 4-story building example is relatively simple. As the building becomes more massive (10 stories with more than 500 bars for example), the performance of human designs can degrade. Potentially, human might still be able to create more optimal designs given more iterations. As a result, embodiments of the invention utilizing the NeuralSizer can save the time and effort by providing a better initial design to structural engineers.

Logical Flow

Figure 13:
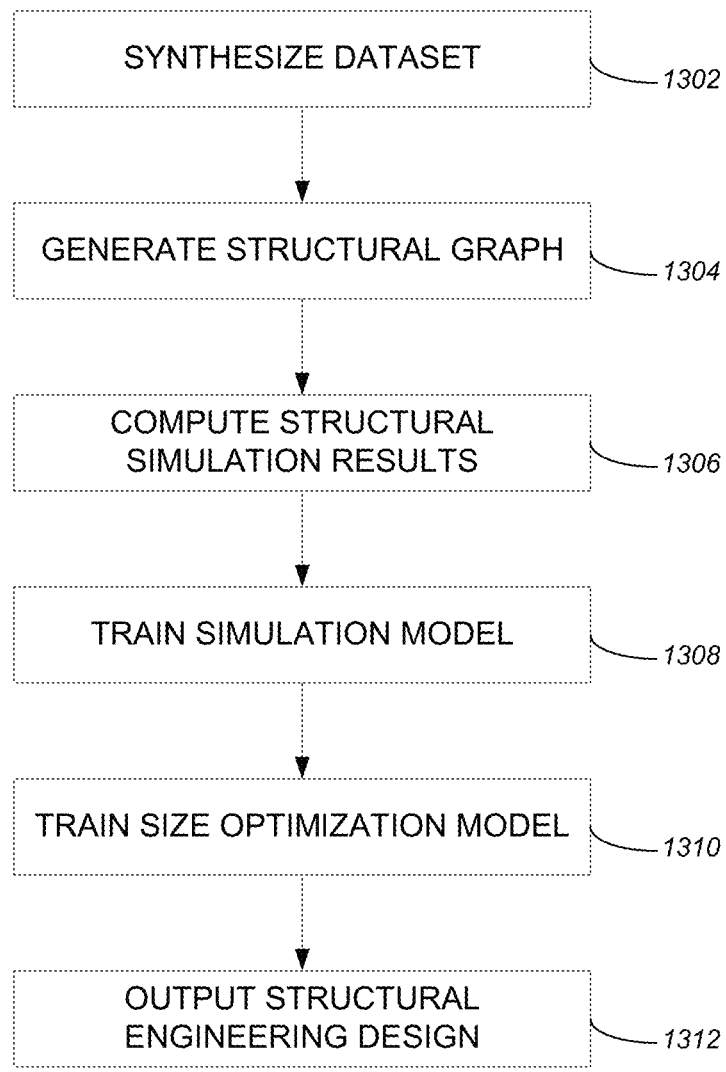
FIG. 13 illustrates the logical flow for optimizing a structural engineering design in accordance with one or more embodiments of the invention.

FIG. 13 illustrates the logical flow for optimizing a structural engineering design in accordance with one or more embodiments of the invention.

At step 1302, a synthesized dataset is synthesized by acquiring a structural skeleton design 104 of an entire building (e.g., an entire building versus a part/subset of the building). The structural skeleton design 104 defines locations and connectivities of bars, wherein every bar represents a column or beam of the building.

At step 1304, the structural skeleton design 104 is represented as a structural graph with each bar represented as a graph node and an edge connecting two graph nodes corresponding to two bars that are joined together in the structural skeleton design 104.

At step 1306, structural simulation results are computed for the synthetic dataset based on the structural graph, various loads, and a structural analysis.

At step 1308, a simulation model (that approximates structural simulation results 206) is trained based on the structural simulation results. To train the simulation model, steps of embedding/encoding, updating/propagating, and decoding are performed. More specifically, each graph node is embed into the simulation model. Thereafter, the embedded graph nodes are iteratively updated based on an aggregated message to obtain final embeddings of all graph nodes. Such an aggregated message may include forces and reaction forces between bars, and/or may integrate/include a position-aware message that provides global information to help identify load conditions. The final embeddings are then decoded to output predicted drift ratios and a classification regarding whether a ground-truth drift ratio exceeds a drift ratio limit.

The simulation model may also be used to determine a multitask loss based on the predicted drift ratios and the classification. Thereafter, the simulation model may be further trained (e.g., may undergo additional machine learning) based on the multitask loss. In addition, it may be noted that the simulation model may serve as a surrogate for a finite element analysis structural analysis.

At step 1310, a size optimization model (e.g., the NueralSizer 202) is trained for the structural skeleton design. The size optimization model determines cross-section sizes for the bars to satisfy a building mass objective and building constraints. Further, the size optimization model is based on the output from the simulation model. Similar to the simulation model, the size optimization model may include an embedding/encoding and propagation steps. Specifically, each graph node may be embed into the size optimization model, wherein the size optimization model optimizes cross-section sizes. Thereafter, the embedded graph nodes may be iteratively updated based on an aggregated message to obtain final embeddings of all graph nodes. Subsequently, the final embeddings concatenated by a graph embedding may be mapped to a probability over cross-sections.

Utilizing the size optimization model, a differentiable loss may be determined based on the building mass objective and building constraints. Such building constraints may include a drift ratio constraint (that requires a drift ratio for each story of the entire building to be less than a limit under lateral seismic loads), a variety constraint (that sets a maximum number of different cross-section types used), and/or an entropy constraint (that is based on an entropy output for each bar, a maximum entropy over different cross-sections, and a defined target ratio). Thereafter, the size optimization model may be further trained (e.g., undergo additional machine learning) based on the differentiable loss.

At step 1312, the structural engineering design is output from the size optimization model. For example, the simulation model and size optimization model may be utilized to visualize studies for a procurement, a fabrication, and a construction of the structural engineering design.

Hardware Environment

Figure 14:
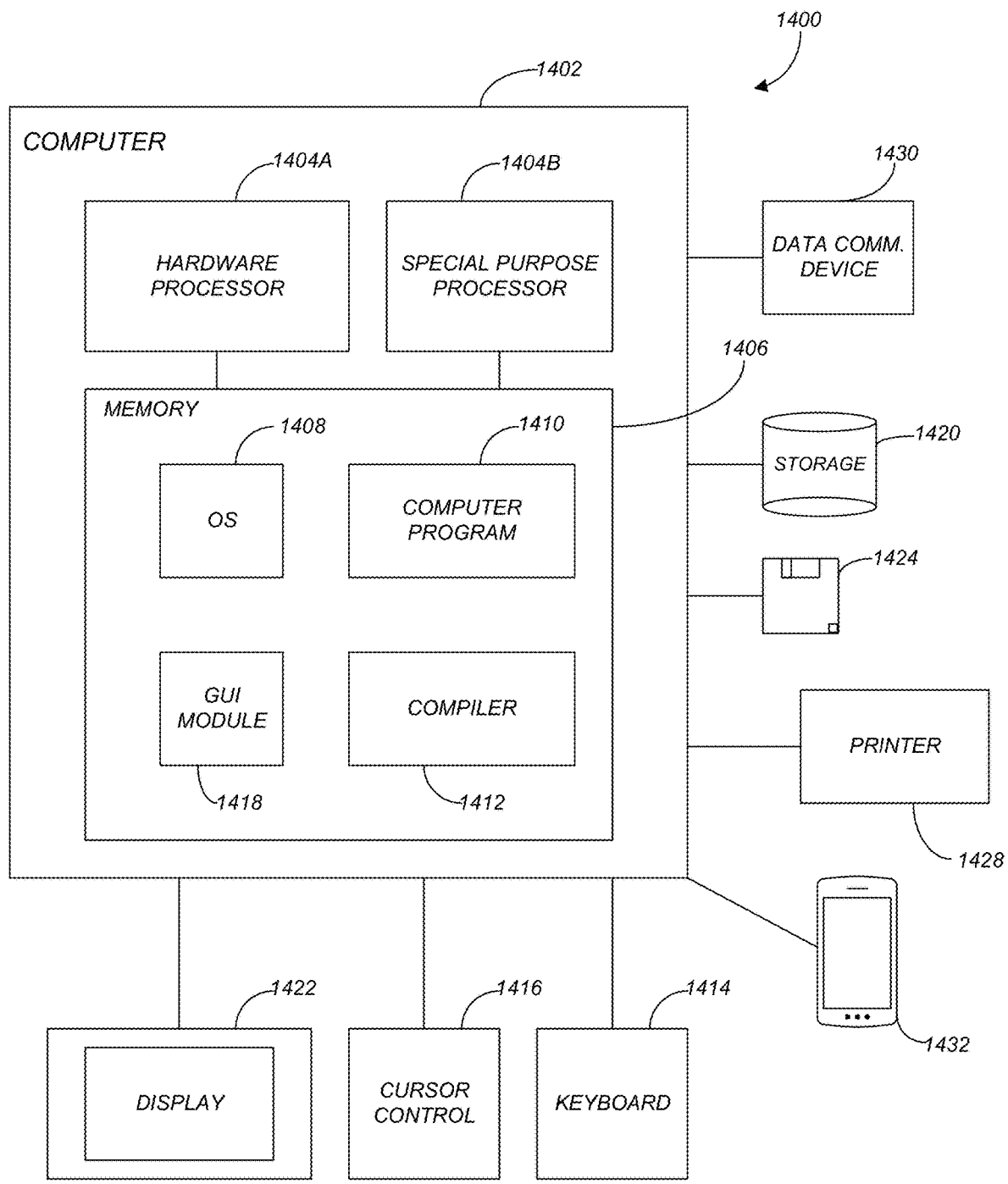
FIG. 14 is an exemplary hardware and software environment used to implement one or more embodiments of the invention.

FIG. 14 is an exemplary hardware and software environment 1400 (referred to as a computer-implemented system and/or computer-implemented method) used to implement one or more embodiments of the invention. The hardware and software environment includes a computer 1402 and may include peripherals. Computer 1402 may be a user/client computer, server computer, or may be a database computer. The computer 1402 comprises a hardware processor 1404A and/or a special purpose hardware processor 1404B (hereinafter alternatively collectively referred to as processor 1404) and a memory 1406, such as random access memory (RAM). The computer 1402 may be coupled to, and/or integrated with, other devices, including input/output (I/O) devices such as a keyboard 1414, a cursor control device 1416 (e.g., a mouse, a pointing device, pen and tablet, touch screen, multi-touch device, etc.) and a printer 1428. In one or more embodiments, computer 1402 may be coupled to, or may comprise, a portable or media viewing/listening device 1432 (e.g., an MP3 player, IPOD, NOOK, portable digital video player, cellular device, personal digital assistant, etc.). In yet another embodiment, the computer 1402 may comprise a multi-touch device, mobile phone, gaming system, internet enabled television, television set top box, or other internet enabled device executing on various platforms and operating systems.

In one embodiment, the computer 1402 operates by the hardware processor 1404A performing instructions defined by the computer program 1410 (e.g., a computer-aided design [CAD] application) under control of an operating system 1408. The computer program 1410 and/or the operating system 1408 may be stored in the memory 1406 and may interface with the user and/or other devices to accept input and commands and, based on such input and commands and the instructions defined by the computer program 1410 and operating system 1408, to provide output and results.

Output/results may be presented on the display 1422 or provided to another device for presentation or further processing or action. In one embodiment, the display 1422 comprises a liquid crystal display (LCD) having a plurality of separately addressable liquid crystals. Alternatively, the display 1422 may comprise a light emitting diode (LED) display having clusters of red, green and blue diodes driven together to form full-color pixels. Each liquid crystal or pixel of the display 1422 changes to an opaque or translucent state to form a part of the image on the display in response to the data or information generated by the processor 1404 from the application of the instructions of the computer program 1410 and/or operating system 1408 to the input and commands. The image may be provided through a graphical user interface (GUI) module 1418. Although the GUI module 1418 is depicted as a separate module, the instructions performing the GUI functions can be resident or distributed in the operating system 1408, the computer program 1410, or implemented with special purpose memory and processors.

In one or more embodiments, the display 1422 is integrated with/into the computer 1402 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD, SURFACE Devices, etc.), portable/handheld game/music/video player/console devices (e.g., IPOD TOUCH, MP3 players, NINTENDO SWITCH, PLAYSTATION PORTABLE, etc.), touch tables, and walls (e.g., where an image is projected through acrylic and/or glass, and the image is then backlit with LEDs).

Some or all of the operations performed by the computer 1402 according to the computer program 1410 instructions may be implemented in a special purpose processor 1404B. In this embodiment, some or all of the computer program 1410 instructions may be implemented via firmware instructions stored in a read only memory (ROM), a programmable read only memory (PROM) or flash memory within the special purpose processor 1404B or in memory 1406. The special purpose processor 1404B may also be hardwired through circuit design to perform some or all of the operations to implement the present invention. Further, the special purpose processor 1404B may be a hybrid processor, which includes dedicated circuitry for performing a subset of functions, and other circuits for performing more general functions such as responding to computer program 1410 instructions. In one embodiment, the special purpose processor 1404B is an application specific integrated circuit (ASIC).

The computer 1402 may also implement a compiler 1412 that allows an application or computer program 1410 written in a programming language such as C, C++, Assembly, SQL, PYTHON, PROLOG, MATLAB, RUBY, RAILS, HASKELL, or other language to be translated into processor 1404 readable code. Alternatively, the compiler 1412 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 1410 accesses and manipulates data accepted from I/O devices and stored in the memory 1406 of the computer 1402 using the relationships and logic that were generated using the compiler 1412.

The computer 1402 also optionally comprises an external communication device such as a modem, satellite link, Ethernet card, or other device for accepting input from, and providing output to, other computers 1402.

In one embodiment, instructions implementing the operating system 1408, the computer program 1410, and the compiler 1412 are tangibly embodied in a non-transitory computer-readable medium, e.g., data storage device 1420, which could include one or more fixed or removable data storage devices, such as a zip drive, floppy disc drive 1424, hard drive, CD-ROM drive, tape drive, etc. Further, the operating system 1408 and the computer program 1410 are comprised of computer program 1410 instructions which, when accessed, read and executed by the computer 1402, cause the computer 1402 to perform the steps necessary to implement and/or use the present invention or to load the program of instructions into a memory 1406, thus creating a special purpose data structure causing the computer 1402 to operate as a specially programmed computer executing the method steps described herein. Computer program 1410 and/or operating instructions may also be tangibly embodied in memory 1406 and/or data communications devices 1430, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 1402.

Figure 15:
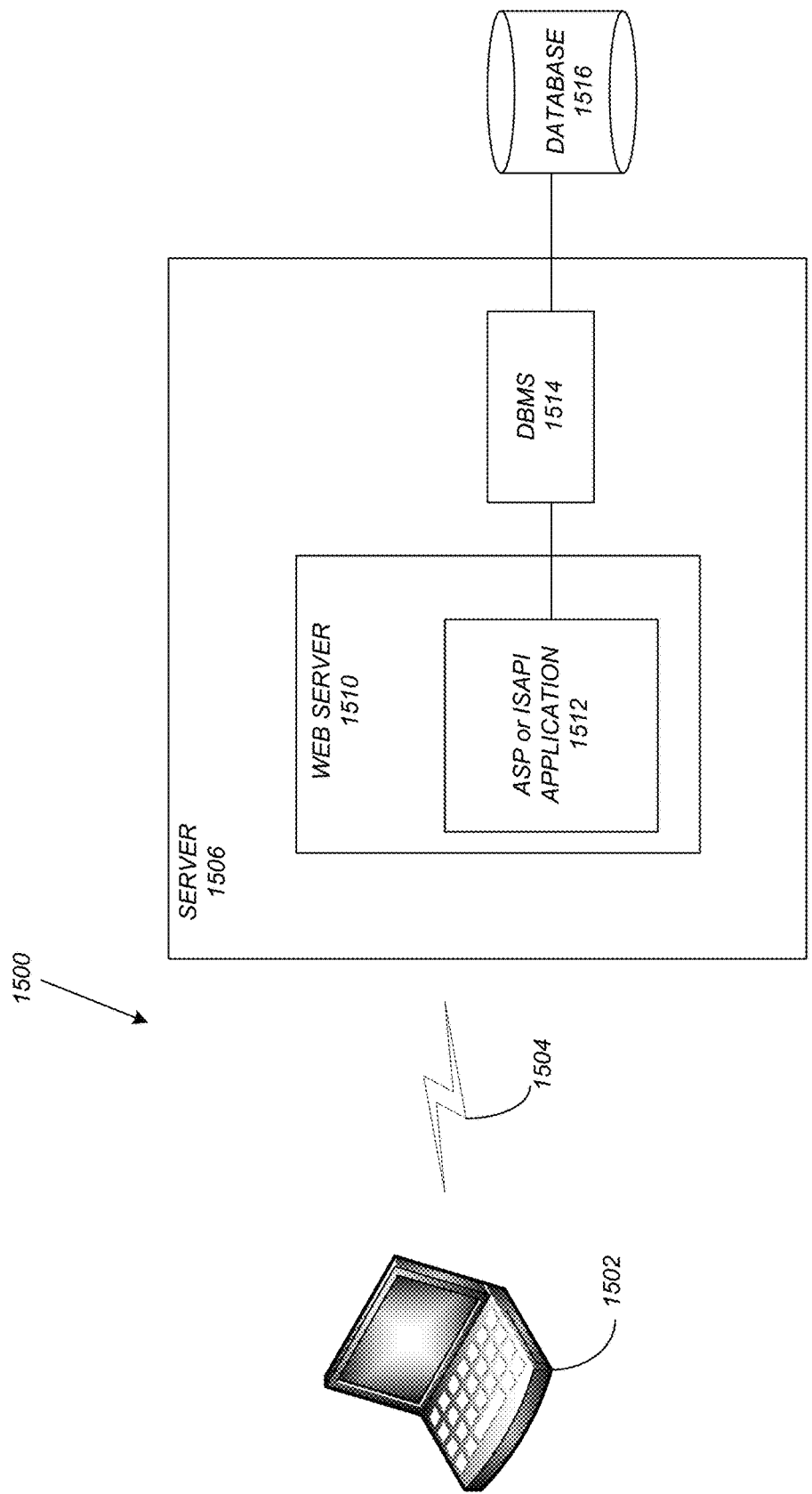
FIG. 15 schematically illustrates a typical distributed/cloud-based computer system in accordance with one or more embodiments of the invention.

FIG. 15 schematically illustrates a typical distributed/cloud-based computer system 1500 using a network 1504 to connect client computers 1502 to server computers 1506. A typical combination of resources may include a network 1504 comprising the Internet, LANs (local area networks), WANs (wide area networks), SNA (systems network architecture) networks, or the like, clients 1502 that are personal computers or workstations (as set forth in FIG. 14), and servers 1506 that are personal computers, workstations, minicomputers, or mainframes (as set forth in FIG. 14). However, it may be noted that different networks such as a cellular network (e.g., GSM [global system for mobile communications] or otherwise), a satellite based network, or any other type of network may be used to connect clients 1502 and servers 1506 in accordance with embodiments of the invention.

A network 1504 such as the Internet connects clients 1502 to server computers 1506. Network 1504 may utilize ethernet, coaxial cable, wireless communications, radio frequency (RF), etc. to connect and provide the communication between clients 1502 and servers 1506. Further, in a cloud-based computing system, resources (e.g., storage, processors, applications, memory, infrastructure, etc.) in clients 1502 and server computers 1506 may be shared by clients 1502, server computers 1506, and users across one or more networks. Resources may be shared by multiple users and can be dynamically reallocated per demand. In this regard, cloud computing may be referred to as a model for enabling access to a shared pool of configurable computing resources.

Clients 1502 may execute a client application or web browser and communicate with server computers 1506 executing web servers 1510. Such a web browser is typically a program such as MICROSOFT INTERNET EXPLORER/ EDGE, MOZILLA FIREFOX, OPERA, APPLE SAFARI, GOOGLE CHROME, etc. Further, the software executing on clients 1502 may be downloaded from server computer 1506 to client computers 1502 and installed as a plug-in or ACTIVEX control of a web browser. Accordingly, clients 1502 may utilize ACTIVEX components/component object model (COM) or distributed COM (DCOM) components to provide a user interface on a display of client 1502. The web server 1510 is typically a program such as MICROSOFT'S INTERNET INFORMATION SERVER.

Web server 1510 may host an Active Server Page (ASP) or Internet Server Application Programming Interface (ISAPI) application 1512, which may be executing scripts. The scripts invoke objects that execute business logic (referred to as business objects). The business objects then manipulate data in database 1516 through a database management system (DBMS) 1514. Alternatively, database 1516 may be part of, or connected directly to, client 1502 instead of communicating/obtaining the information from database 1516 across network 1504. When a developer encapsulates the business functionality into objects, the system may be referred to as a component object model (COM) system. Accordingly, the scripts executing on web server 1510 (and/or application 1512) invoke COM objects that implement the business logic. Further, server 1506 may utilize MICROSOFT'S TRANSACTION SERVER (MTS) to access required data stored in database 1516 via an interface such as ADO (Active Data Objects), OLE DB (Object Linking and Embedding DataBase), or ODBC (Open Data-Base Connectivity).

Generally, these components 1500-1516 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/ or data, when read, executed, and/or interpreted, results in the steps necessary to implement and/or use the present invention being performed. Although the terms "user computer", "client computer", and/or "server computer" are referred to herein, it is understood that such computers 1502 and 1506 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 1502 and 1506. Embodiments of the invention are implemented as a software/CAD application on a client 1502 or server computer 1506. Further, as described above, the client 1502 or server computer 1506 may comprise a thin client device or a portable device that has a multi-touch-based display.

Embodiments of the invention are implemented as a software application on a client 1502 or server computer 1506. Further, as described above, the client 1502 or server computer 1506 may comprise a thin client device or a portable device that has a multi-touch-based display.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

In summary, embodiments of the invention provide an end-to-end learning pipeline to solve the size design optimization problem. Trained as a neural approximator for structural simulation, NeuralSim shows ~97% accuracy and is 1900 times faster than simulation tools. As a consequence, it can not only provide gradients to upstream models due to the differentiable nature, but also be used to provide quick evaluation in evolutionary solvers or instant feedback after every human design decision. NeuralSizer is trained to output optimal cross-sections subject to the optimization objective and constraints. The design outputs of NeuralSizer satisfy the constraint and are comparable to or sometimes better than the optimal solution of the genetic algorithm. Moreover, they can be used as initial seeds for the genetic algorithm, which speeds up the convergence and further optimizes the design. Last but not least, the design outputs demonstrate reasonable design rules and thus can also be used as the initial design for structural engineers to save design iterations. As described above, the skeleton design phase in FIG. 1 is part of the pipeline and defines the graph generation problem. Further, except from columns and beams, embodiments of the invention and the graph representation may not cover all the structural components, such as walls and panels. In addition, although the general structural constraints can be applied to any buildings in the world, the local building codes may be varied. Converting the building code as part of the input provides potential solution.

Buildings account for 40 percent of the global carbon dioxide emission ([International 2017). Minimizing the mass of a building, one can not only reduce the material cost, but also decrease the carbon dioxide emission during the fabrication, transportation, and construction process, and therefore, make a huge impact to the environment. However, this domain is under-explored in the machine learning community. Accordingly, embodiments of the invention provide a potential solution in this domain.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[Achiam 2017] Achiam, J., Held, D., Tamar, A., and Abbeel, P. Constrained policy optimization. In *Proceedings of the 34th International Conference on Machine Learning-Volume* 70, pp. 22-31. JMLR.org, 2017.

[Balogh 2012] Balogh, T. and Vigh, L. Genetic algorithm based optimization of regular steel building structures subjected to seismic effects. In *Proceedings 15th world conference on earthquake engineering*, pp. 1-10, 2012.

[Battaglia 2018] Battaglia, P. W., Hamrick, J. B., Bapst, V., Sanchez-Gonzalez, A., Zambaldi, V., Malinowski, M., Tacchetti, A., Raposo, D., Santoro, A., Faulkner, R., et al. Relational inductive biases, deep learning, and graph networks. *arXiv preprint arXiv:* 1806.01261, 2018.

[Bello 2016] Bello, I., Pham, H., Le, Q. V., Norouzi, M., and Bengio, S. Neural combinatorial optimization with reinforcement learning. *arXiv preprint arXiv:* 1611.09940, 2016.

[Boyd 2004] Boyd, S. and Vandenberghe, L. *Convex optimization*. Cam-bridge university press, 2004.

[Cheng 2017] Cheng, Y., KOU, C. h., Li, C., et al. Optimal design of steel columns with axial load using artificial neural networks. *DEStech Transactions on Engineering and Technology Research*, (amme), 2017.

[Cui 2019] Cui, Z., Henrickson, K., Ke, R., and Wang, Y. Traffic graph convolutional recurrent neural network: A deep learning framework for network-scale traffic learning and fore-casting. *IEEE Transactions on Intelligent Transportation Systems*, 2019.

[Do 2019] Do, K., Tran, T., and Venkatesh, S. Graph transformation policy network for chemical reaction prediction. In *Proceedings of the 25th ACM SIGKDD International Conference on Knowledge Discovery & Data Mining*, pp. 750-760, 2019.

[Fout 2017] Fout, A., Byrd, J., Shariat, B., and Ben-Hur, A. Protein interface prediction using graph convolutional networks. In *Advances in neural information processing systems*, pp. 6530-6539, 2017.

[Frans 2018] Frans, K. and Cheng, C. Y. Unsupervised image to sequence translation with canvas-drawer networks. *arXiv preprint arXiv:* 1809.08340, 2018.

Greco, L. Machine learning and optimization techniques for steel connections. In *Proceedings of IASS Annual Symposia*, volume 2018, pp. 1-8. International Association for Shell and Spatial Structures (IASS), 2018.

[Guo 2019] Guo, S., Lin, Y., Feng, N., Song, C., and Wan, H. Attention based spatial-temporal graph convolutional networks for traffic flow forecasting. In *Proceedings of the AAAI Conference on Artificial Intelligence*, volume 33, pp. 922-929, 2019.

[Haarnoja 2018] Haarnoja, T., Zhou, A., Hartikainen, K., Tucker, G., Ha, S., Tan, J., Kumar, V., Zhu, H., Gupta, A., Abbeel, P., et al. Soft actor-critic algorithms and applications. *arXiv preprint arXiv:* 1812.05905, 2018.

[Hamrick 2018] Hamrick, J. B., Allen, K. R., Bapst, V., Zhu, T., McKee, K. R., Tenenbaum, J. B., and Battaglia, P. W. Relational inductive bias for physical construction in humans and machines. *arXiv preprint arXiv:* 1806.01203, 2018.

[Hasançebi 2013] Hasançebi, O. and Dumlupinar, T. A neural network approach for approximate force response analyses of a bridge population. *Neural Computing and Applications*, 22 (3-4): 755-769, 2013.

[Imran 2019] Imran, M., Shi, D., Tong, L., and Waqas, H. M. Design optimization of composite submerged cylindrical pressure hull using genetic algorithm and finite element analysis. *Ocean Engineering*, 190:106443, 2019.

[International 2017] International Energy Agency. *World Energy Balances* 2017. 2017. doi: https://doi.org/https://doi.org/10.1787/world energy bal-2017-en. URL https://www.oecd-ilibrary.org/content/publication/world_energy_bal-2017-en.

[Jang 2016] Jang, E., Gu, S., and Poole, B. Categorical reparameterization with gumbel-softmax. *arXiv preprint arXiv:* 1611.01144, 2016.

[Jin 2018a] Jin, W., Barzilay, R., and Jaakkola, T. Junction tree variational autoencoder for molecular graph generation. *arXiv preprint arXiv:* 1802.04364, 2018a.

[Jin 2018b] Jin, W., Yang, K., Barzilay, R., and Jaakkola, T. Learning multimodal graph-to-graph translation for molecular optimization. *arXiv preprint arXiv:* 1812.01070, 2018b.

[Kipf 2018] Kipf, T., Fetaya, E., Wang, K. C., Welling, M., and Zemel, R. Neural relational inference for interacting systems. *arXiv preprint arXiv:* 1802.04687, 2018.

[Kipf 2016] Kipf, T. N. and Welling, M. Semi-supervised classification with graph convolutional networks. *arXiv preprint arXiv:* 1609.02907, 2016.

[Kool 2018] Kool, W., Van Hoof, H., and Welling, M. Attention, learn to solve routing problems! *arXiv preprint arXiv:* 1803.08475, 2018.

[Li 2018] Li, Z., Chen, Q., and Koltun, V. Combinatorial optimization with graph convolutional networks and guided tree search. In *Advances in Neural Information Processing Systems*, pp. 539-548, 2018.

Prates, M., Avelar, P. H., Lemos, H., Lamb, L. C., and Vardi, M. Y. Learning to solve np-complete problems: A graph neural network for decision tsp. In *Proceedings of the AAAI Conference on Artificial Intelligence*, volume 33, pp. 4731-4738, 2019.

[Rajeev 1997] Rajeev, S. and Krishnamurthy, C. Genetic algorithms-based methodologies for design optimization of trusses. *Journal of structural engineering*, 123 (3): 350-358, 1997.

[Sanchez 2018] Sanchez-Gonzalez, A., Heess, N., Springenberg, J. T., Merel, J., Riedmiller, M., Hadsell, R., and Battaglia, P. Graph networks as learnable physics engines for inference and control. *arXiv preprint arXiv:* 1806.01242, 2018.

[Sanchez 2020] Sanchez-Gonzalez, A., Godwin, J., Pfaff, T., Ying, R., Leskovec, J., and Battaglia, P. W. Learning to simulate complex physics with graph networks. *arXiv preprint arXiv:* 2002.09405, 2020.

[Tamura 2018] Tamura, T., Ohsaki, M., and Takagi, J. Machine learning for combinatorial optimization of brace placement of steel frames. *Japan Architectural Review*, 1 (4): 419-430, 2018.

[Tian 2019] Tian, Y., Luo, A., Sun, X., Ellis, K., Freeman, W. T., Tenenbaum, J. B., and Wu, J. Learning to infer and execute 3d shape programs. *arXiv preprint arXiv:* 1901.02875, 2019.

[Torky 2018] Torky, A. A. and Aburawwash, A. A. A deep learning approach to automated structural engineering of prestressed members. 2018.

[Veličković 2017] Veličković, P., Cucurull, G., Casanova, A., Romero, A., Lio, P., and Bengio, Y. Graph attention networks. *arXiv preprint arXiv:* 1710.10903, 2017.

[Watters 2017] Watters, N., Zoran, D., Weber, T., Battaglia, P., Pascanu, R., and Tacchetti, A. Visual interaction networks: Learning a physics simulator from video. In *Advances in neural information processing systems*, pp. 4539-4547, 2017.

[Wu 2020] Wu, Z., Pan, S., Chen, F., Long, G., Zhang, C., and Philip, S. Y. A comprehensive survey on graph neural networks. *IEEE Transactions on Neural Networks and Learning Systems*, 2020.

[Xu 2018] Xu, K., Hu, W., Leskovec, J., and Jegelka, S. How powerful are graph neural networks? *arXiv preprint arXiv:* 1810.00826, 2018.

[You 2018] You, J., Liu, B., Ying, Z., Pande, V., and Leskovec, J. Graph convolutional policy network for goal-directed molecular graph generation. In *Advances in neural information processing systems*, pp. 6410-6421, 2018.

[You 2019] You, J., Ying, R., and Leskovec, J. Position-aware graph neural networks. *arXiv preprint arXiv: 1906.04817*, 2019.

[Zheng 2018] Zheng, N., Jiang, Y., and Huang, D. Strokenet: A neural painting environment. 2018.

[Zhou 2018] Zhou, J., Cui, G., Zhang, Z., Yang, C., Liu, Z., Wang, L., Li, C., and Sun, M. Graph neural networks: A review of methods and applications. *arXiv preprint arXiv: 1812.08434*, 2018.

[Zhou 2016] Zhou, X., Wan, Q., Zhang, W., Xue, X., and Wei, Y. Model-based deep hand pose estimation. *arXiv preprint arXiv: 1606.06854*, 2016.

The invention claimed is:

1. A computer-implemented method for optimizing a structural engineering design, comprising:
   acquiring a structural skeleton design of an entire building, wherein the structural skeleton design defines locations and connectivities of bars, wherein every bar represents a column or beam of the building;
   training a simulation model based on computed structural simulation results for a synthetic dataset acquired from the structural skeleton design of the building based on a structural graph, various loads, and a structural analysis, wherein the simulation model serves as a surrogate for a finite element analysis structural analysis;
   training a size optimization model for the structural skeleton design represented as the structural graph with each bar represented as a graph node and an edge connecting two graph nodes corresponding to two bars that are joined together in the structural skeleton design, wherein cross-section sizes for the bars is based on the size optimization model to satisfy a building mass objective and building constraints, and wherein the size optimization model is further based on the output from the simulation model; and
   outputting the structural engineering design from the size optimization model.

2. The computer-implemented method of claim 1, wherein the training the simulation model comprises:
   embedding each graph node into the simulation model, wherein the simulation model approximates the structural simulation results;
   iteratively updating the embedded graph nodes based on an aggregated message to obtain final embeddings of all graph nodes; and
   decoding the final embeddings to output predicted drift ratios and a classification regarding whether a ground-truth drift ratio exceeds a drift ratio limit.

3. The computer-implemented method of claim 2, wherein the aggregated message comprises:
   forces and reaction forces between two bars.

4. The computer-implemented method of claim 2, wherein the aggregated message comprises:
   a position-aware message that provides global information to help identify load conditions.

5. The computer-implemented method of claim 2, further comprising:
   determining a multitask loss based on the predicted drift ratios and the classification; and
   further training the simulation model based on the multitask loss.

6. The computer-implemented method of claim 1, wherein the training the size optimization model comprises:
   embedding each graph node into the size optimization model, wherein the size optimization model optimizes cross-section sizes;
   iteratively updating the embedded graph nodes based on an aggregated message to obtain final embeddings of all graph nodes; and
   mapping the final embeddings concatenated by a graph embedding to a probability over cross-sections.

7. The computer-implemented method of claim 6, further comprising:
   determining a differentiable loss based on the building mass objective and building constraints; and
   further training the size optimization model based on the differentiable loss.

8. The computer-implemented method of claim 7, wherein the building constraints comprise:
   a drift ratio constraint that requires a drift ratio for each story of the entire building to be less than a limit under lateral seismic loads;
   a variety constraint that sets a maximum number of different cross-section types used; and
   an entropy constraint that is based on an entropy output for each bar, a maximum entropy over different cross-sections, and a defined target ratio.

9. The computer-implemented method of claim 1, further comprising:
   utilizing the simulation model and size optimization model to visualize studies for a procurement, a fabrication, and a construction of the structural engineering design.

10. A computer-implemented system for optimizing a structural engineering design, comprising:
    (a) a computer having a memory;
    (b) a processor executing on the computer;
    (c) the memory storing a set of instructions, wherein the set of instructions, when executed by the processor cause the processor to perform operations comprising:
    (1) acquiring a structural skeleton design of an entire building, wherein the structural skeleton design defines locations and connectivities of bars, wherein every bar represents a column or beam of the building;
    (2) training a simulation model based on computed structural simulation results for a synthetic dataset acquired from the structural skeleton design of the building based on a structural graph, various loads, and a structural analysis, wherein the simulation model serves as a surrogate for a finite element analysis structural analysis;
    (3) training a size optimization model for the structural skeleton design, represented as the structural graph with each bar represented as a graph node and an edge connecting two graph nodes corresponding to two bars that are joined together in the structural skeleton design, wherein cross-section sizes for the bars is based on the size optimization model to satisfy a building mass objective and building constraints, and wherein the size optimization model is further based on the output from the simulation model; and
    (4) outputting the structural engineering design from the size optimization model.

11. The computer-implemented system of claim 10, wherein the operations training the simulation model comprises:
    embedding each graph node into the simulation model, wherein the simulation model approximates the structural simulation results;
    iteratively updating the embedded graph nodes based on an aggregated message to obtain final embeddings of all graph nodes; and decoding the final embeddings to output predicted drift ratios and a classification regarding whether a ground-truth drift ratio exceeds a drift ratio limit.

12. The computer-implemented system of claim 11, wherein the aggregated message comprises:
    forces and reaction forces between two bars.

13. The computer-implemented system of claim 11, wherein the aggregated message comprises:
    a position-aware message that provides global information to help identify load conditions.

14. The computer-implemented system of claim 11, wherein the operations further comprise:
    determining a multitask loss based on the predicted drift ratios and the classification; and
    further training the simulation model based on the multitask loss.

15. The computer-implemented system of claim 11, wherein the operations training the size optimization model comprises:
    embedding each graph node into the size optimization model, wherein the size optimization model optimizes cross-section sizes;
    iteratively updating the embedded graph nodes based on an aggregated message to obtain final embeddings of all graph nodes; and
    mapping the final embeddings concatenated by a graph embedding to a probability over cross-sections.

16. The computer-implemented system of claim 15, wherein the operations further comprise:
    determining a differentiable loss based on the building mass objective and building constraints; and
    further training the size optimization model based on the differentiable loss.

17. The computer-implemented system of claim 16, wherein the building constraints comprise:
    a drift ratio constraint that requires a drift ratio for each story of the entire building to be less than a limit under lateral seismic loads;
    a variety constraint that sets a maximum number of different cross-section types used; and
    an entropy constraint that is based on an entropy output for each bar, a maximum entropy over different cross-sections, and a defined target ratio.

18. The computer-implemented system of claim 11, wherein the operations further comprise:
    utilizing the simulation model and size optimization model to visualize studies for a procurement, a fabrication, and a construction of the structural engineering design.

* * * * *